United States Patent
Camras et al.

(10) Patent No.: US 11,984,540 B2
(45) Date of Patent: May 14, 2024

(54) INORGANIC BONDED DEVICES AND STRUCTURES

(71) Applicant: LUMILEDS LLC, San Jose, CA (US)

(72) Inventors: Michael Camras, San Jose, CA (US);
Jyoti Bhardwaj, Cupertino, CA (US);
Peter Josef Schmidt, Aachen (DE);
Niels Jeroen Van Der Veen, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 18/085,317

(22) Filed: Dec. 20, 2022

(65) Prior Publication Data

US 2023/0207741 A1  Jun. 29, 2023

Related U.S. Application Data

(63) Continuation of application No. 17/129,279, filed on Dec. 21, 2020, now Pat. No. 11,563,150, which is a
(Continued)

(51) Int. Cl.
*H01L 33/44* (2010.01)
*C09K 11/02* (2006.01)
(Continued)

(52) U.S. Cl.
CPC ............. *H01L 33/44* (2013.01); *C09K 11/02* (2013.01); *C23C 16/40* (2013.01);
(Continued)

(58) Field of Classification Search
CPC ..... H01L 33/44; H01L 33/005; H01L 33/505; H01L 2933/2025; C09K 1/102; C23C 16/40; C23C 16/45525; H01S 5/0283
(Continued)

(56) References Cited

U.S. PATENT DOCUMENTS 5,813,753 A   9/1998  Vriens et al.
6,642,652 B2  11/2003 Collins, III et al.
(Continued)

FOREIGN PATENT DOCUMENTS

CN   102208521 A   10/2011
CN   102468415 A   5/2012
(Continued)

OTHER PUBLICATIONS

International Search Report corresponding PCT/US2017/059954, dated Mar. 9, 2018, 6 pages.
(Continued)

*Primary Examiner* — Phuc T Dang

(57) ABSTRACT

An inorganic coating may be applied to bond optically scattering particles or components. Optically scattering particles bonded via the inorganic coating may form a three dimensional film which can receive a light emission, convert, and emit the light emission with one or more changed properties. The inorganic coating may be deposited using a low-pressure deposition technique such as an atomic layer deposition (ALD) technique. Two or more components, such as an LED and a ceramic phosphor layer may be bonded together by depositing an inorganic coating using the ALD technique.

19 Claims, 11 Drawing Sheets

Related U.S. Application Data continuation of application No. 15/802,273, filed on Nov. 2, 2017, now Pat. No. 10,886,437.

(60) Provisional application No. 62/417,237, filed on Nov. 3, 2016, provisional application No. 62/417,262, filed on Nov. 3, 2016.

(51) Int. Cl.
*C23C 16/40* (2006.01)
*C23C 16/455* (2006.01)
*H01L 33/00* (2010.01)
*H01L 33/50* (2010.01)
*H01S 5/028* (2006.01)

(52) U.S. Cl.
CPC ...... *C23C 16/45525* (2013.01); *H01L 33/005* (2013.01); *H01L 33/505* (2013.01); *H01S 5/0283* (2013.01); *H01L 2933/0025* (2013.01); *H01S 5/028* (2013.01)

(58) Field of Classification Search
USPC ......................................................... 257/98
See application file for complete search history.

(56) References Cited

U.S. PATENT DOCUMENTS

| | | | |
|---|---|---|---|
| 6,680,569 | B2 | 1/2004 | Mueller-Mach et al. |
| 6,700,322 | B1 | 3/2004 | Duggal et al. |
| 6,717,353 | B1 | 4/2004 | Mueller et al. |
| 7,038,370 | B2 | 5/2006 | Mueller-Mach et al. |
| 7,061,024 | B2 | 7/2006 | Schmidt et al. |
| 7,361,938 | B2 | 4/2008 | Mueller et al. |
| 7,419,839 | B2 | 9/2008 | Camras et al. |
| 7,462,502 | B2 | 12/2008 | Paolini et al. |
| 7,544,309 | B2 | 6/2009 | Juestel et al. |
| 7,566,155 | B2 | 7/2009 | Schug et al. |
| 7,833,437 | B2 | 11/2010 | Fan et al. |
| 8,445,929 | B2 | 5/2013 | Krames et al. |
| 8,946,728 | B2 | 2/2015 | Kim |
| 9,221,217 | B2 | 12/2015 | Lisec et al. |
| 9,443,833 | B2 | 9/2016 | Oraw |
| 9,543,478 | B2 | 1/2017 | Schricker et al. |
| 9,722,148 | B2 | 8/2017 | Mueller et al. |
| 9,797,577 | B2 | 10/2017 | Harada |
| 10,886,437 | B2 | 1/2021 | Camras et al. |
| 11,563,150 | B2 | 1/2023 | Camras et al. |
| 2002/0030194 | A1 | 3/2002 | Camras et al. |
| 2005/0093008 | A1 | 5/2005 | Suehiro et al. |
| 2006/0012299 | A1 | 1/2006 | Suehiro et al. |
| 2006/0255710 | A1 | 11/2006 | Mueller-Mach et al. |
| 2007/0172580 | A1 | 7/2007 | Fan et al. |
| 2008/0122343 | A1 | 5/2008 | Maruyama et al. |
| 2008/0138633 | A1 | 6/2008 | Park et al. |
| 2009/0051278 | A1 | 2/2009 | Saneto et al. |
| 2009/0014741 | A1 | 6/2009 | Masuda et al. |
| 2011/0022160 | A1* | 1/2011 | Flanagan ............... A61L 31/16 623/1.42 |
| 2012/0086028 | A1 | 4/2012 | Beeson et al. |
| 2012/0112623 | A1 | 5/2012 | Kobashi |
| 2012/0199793 | A1 | 8/2012 | Weimer et al. |
| 2012/0237762 | A1 | 9/2012 | Hunt et al. |
| 2012/0313082 | A1 | 12/2012 | Jang et al. |
| 2013/0287936 | A1 | 10/2013 | Jang et al. |
| 2014/0099432 | A1 | 4/2014 | Tseng et al. |
| 2014/0339495 | A1* | 11/2014 | Bibl ...................... H01L 33/502 257/13 |
| 2015/0255683 | A1 | 9/2015 | Stoll et al. |
| 2015/0262978 | A1 | 9/2015 | Shibata |
| 2015/0310963 | A1* | 10/2015 | Markham ............ H05K 3/1258 427/118 |
| 2015/0311474 | A1 | 10/2015 | Basil et al. |
| 2015/0318453 | A1 | 11/2015 | Hung et al. |
| 2016/0084476 | A1 | 3/2016 | Koole et al. |
| 2016/0149097 | A1 | 5/2016 | Saka et al. |
| 2016/0312118 | A1 | 10/2016 | Fiedler et al. |
| 2016/0315446 | A1 | 10/2016 | Taeger et al. |
| 2016/0341867 | A1 | 11/2016 | Fang et al. |
| 2016/0348857 | A1 | 12/2016 | Miyata |
| 2016/0372634 | A1 | 12/2016 | Yoo et al. |
| 2017/0023188 | A1 | 1/2017 | Mima et al. |
| 2017/0037312 | A1 | 2/2017 | Fujii et al. |
| 2017/0047551 | A1 | 2/2017 | Peng |
| 2017/0278605 | A1 | 9/2017 | Lisec et al. |

FOREIGN PATENT DOCUMENTS

| | | | | |
|---|---|---|---|---|
| CN | 103037620 A | * | 4/2013 | ....... H01L 23/49822 |
| CN | 103975040 A | | 8/2014 | |
| CN | 104992840 A | | 10/2015 | |
| DE | 102015101413 A1 | | 8/2016 | |
| JP | 2004193581 A | | 7/2004 | |
| JP | 2005055622 A | | 3/2005 | |
| JP | 2009524736 A | | 7/2009 | |
| JP | 2013229438 A | | 11/2013 | |
| JP | 2013247067 A | | 12/2013 | |
| JP | 2016026404 A | | 2/2016 | |
| JP | 2016035032 A | | 3/2016 | |
| JP | 2016100485 A | | 5/2016 | |
| JP | 2016127199 A | | 7/2016 | |
| KR | 20090080053 A1 | * | 7/2009 | ............. H01L 33/44 |
| KR | 20160069829 A | | 6/2016 | |
| TW | 480899 B | | 3/2002 | |
| TW | 552724 B | | 9/2003 | |
| TW | 201547054 A | | 12/2015 | |
| WO | 2012/038592 A1 | | 3/2012 | |
| WO | WO-2012028695 A2 | * | 3/2012 | ............. C23C 18/08 |
| WO | 2013/171360 A1 | | 11/2013 | |
| WO | 2015/138495 A1 | | 9/2015 | |
| WO | 2016/041838 A1 | | 3/2016 | |
| WO | 2016/096636 A1 | | 6/2016 | |
| WO | WO-2016087718 A1 | * | 6/2016 | ............. C23C 14/28 |
| WO | WO-2016162441 A | * | 10/2016 | .......... B01J 19/0093 |
| WO | 2018/085670 A1 | | 5/2018 | |

OTHER PUBLICATIONS

Written Opinion of the International Search Authority corresponding to PCT/US2017/059954, dated Mar. 29, 2018, 6 pages.
International Preliminary Report on Patentability corresponding to PCT/US2017/059954, dated May 7, 2019, 15 pages.
Stober et al., "Controlled Growth of Monodisperse Silica Spheres in the Micron Size Range", Journal of Colloid and Interface Science 25, 62-69 (1968).

* cited by examiner

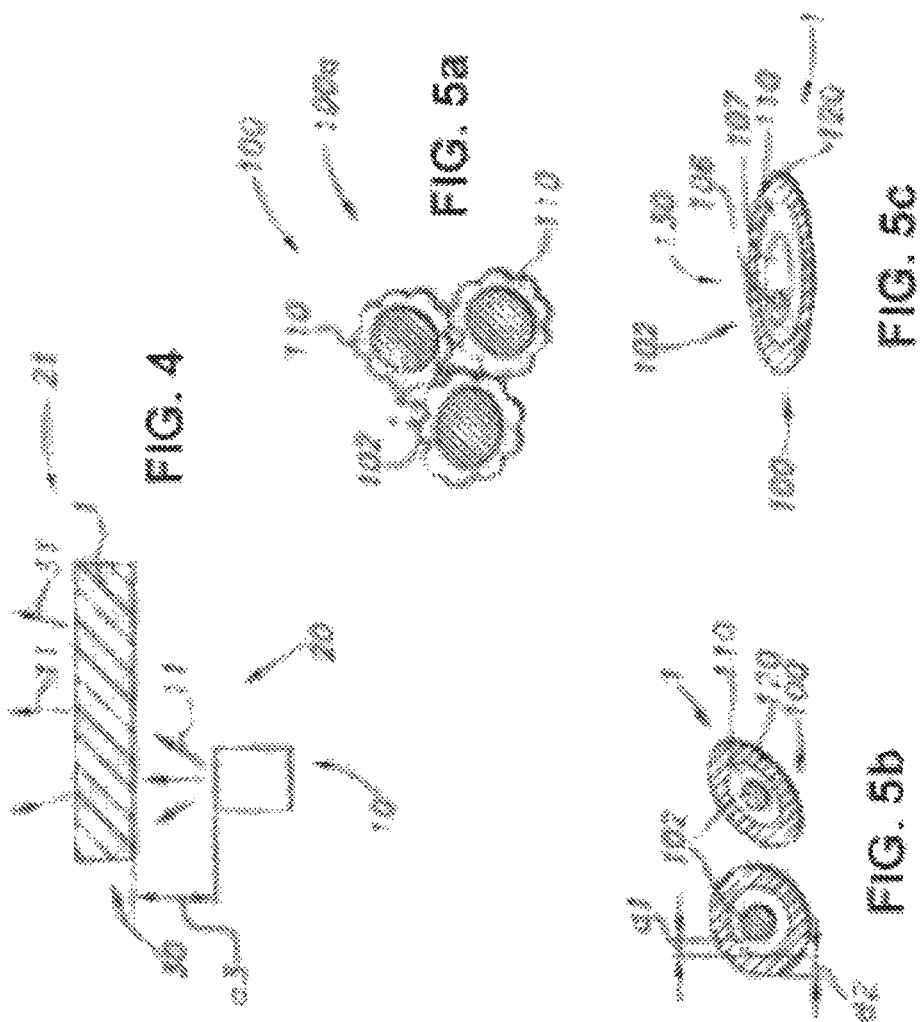

INORGANIC BONDED DEVICES AND STRUCTURES

CROSS REFERENCE TO RELATED APPLICATIONS

This application is a continuation of U.S. application Ser. No. 17/129,279 (now U.S. Pat. No. 11,563,150), filed Dec. 21, 2020, which claims priority to U.S. application Ser. No. 15/802,273, filed Nov. 2, 2017 (now U.S. Pat. No. 10,886,437), which claims priority to U.S. Provisional Patent Application No. 62/417,262 filed Nov. 3, 2016 and U.S. Provisional Patent Application No. 62/417,237 filed Nov. 3, 2016. All of the above-listed applications are incorporated by reference herein in their entirety. This application is a continuation of U.S. application Ser. No. 17/129,279, filed Dec. 21, 2020, which claims priority to U.S. application Ser. No. 15/802,273, filed Nov. 2, 2017 (now U.S. Pat. No. 10,886,437), which claims priority to U.S. Provisional Patent Application No. 62/417,262 filed Nov. 3, 2016 and U.S. Provisional Patent Application No. 62/417,237 filed Nov. 3, 2016. All of the above-listed applications are incorporated by reference herein in their entirety.

BACKGROUND

Luminescent particles or layers in a semiconductor device that are deposited or bonded using traditional techniques, for example with silicone, may suffer from a shorter life span due to degradation of the organic binder. Even in a more costly processes where luminescent particles sintered together at high temperature to form a ceramic or are incorporated into a glass, the resulting wavelength converting plate is typically attached to a semiconductor device with an organic glue that may degrade and discolor under operation at high temperature and high flux densities of short wavelength light, for example blue or UV. As a result, devices with luminescent particles deposited or bonded using traditional techniques may need to be replaced on a less than ideal time cycle. Additionally substrates, other than semiconductor devices, bonded using traditional techniques may also experience these unwanted effects. Accordingly, such techniques are deficient when it comes to bonding luminescent particles and/or ceramic layers to devices and other substrates.

SUMMARY

In accordance with aspects of the invention, a plurality of optically scattering and/or luminescent particles may be deposited onto a component. An inorganic coating may be deposited onto the plurality of optically scattering particles using a low-pressure deposition technique. The plurality of optically scattering particles may be bonded together to form a three-dimensional film, such that an optically scattering and/or luminescent particle is bonded to another optically scattering particle and/or luminescent by the inorganic coating. The inorganic coating may comprise multiple layers and one or more of the layers may be an oxide coating and the optically scattering and/or luminescent particles may be deposited using a technique such as sedimentation, electrophoretic deposition (EPD), stenciling, or dispensing. The optically scattering particles and/or luminescent may be phosphor particles and the component may be a metal, a substrate, a ceramic, a semiconductor, an insulator, or a light emitting device, for example a light emitting diode (LED) or laser. The low-pressure deposition technique may be an atomic layer deposition (ALD) technique. The component may be removed or partially removed to allow the three-dimensional film to receive a photoexcitation at one surface and emit a light from the opposite surface. The component may also be transparent to the light emission and not removed. The component may also be thermally conductive. The component may also be opaque to the light emission, may be reflective and photoexcitation may be received on the same surface that light is emitted. The component itself may be the source of excitation such as a LED or laser. The inorganic coating's coefficient of thermal expansion (CTE) may be substantially matched to the CTE of the plurality of optically scattering particles or to the CTE of the component. The inorganic coating's index of refraction may be substantially matched to the index of refraction of the plurality of optically scattering particles or to the index of refraction of the component.

In accordance with an implementation, a three-dimensional film may receive a light of a first wavelength. The three-dimensional film may absorb or partially absorb this light and emit a light of a second wavelength. The light emitted may be the second wavelength or a combination of first and second wavelength.

In accordance with an implementation, multiple three-dimensional films may be configured to be adjacent to each other, for example in a linear or matrix array, such that a separation layer, such as an absorbing material or a reflective material, is located between the adjacent three-dimensional films. The multiple three-dimensional films may be placed on top of individual light emitting components that can, for example be individually activated, such that each three-dimensional film is configured to produce a light emission independent of or isolated from each other with reduced cross talk for example. Alternatively, the light emitting pixels can be excited from a rastered light source such as a laser or electron beam. Such an arrangement may be used in systems such as automotive lighting, for example adaptive front lighting system (AFS), camera flash, displays, or the like.

In accordance with another implementation, a surface of a component and/or ceramic phosphor layer may be roughened or by having groves added to a surface. An inorganic coating may be deposited onto the roughened or trenched surfaces using a low-pressure deposition technique binding the two components together with the inorganic coating.

BRIEF DESCRIPTION OF THE DRAWINGS

The accompanying drawings, which are included to provide a further understanding of the disclosed subject matter, are incorporated in and constitute a part of this specification. The drawings also illustrate implementations of the disclosed subject matter and together with the detailed description serve to explain the principles of implementations of the disclosed subject matter. No attempt is made to show structural details in more detail than may be necessary for a fundamental understanding of the disclosed subject matter and various ways in which it may be practiced.

FIG. 4 schematically depicts a lighting device;

FIG. 5a schematically depicts luminescent powder particles having a sol-gel first coating;

FIG. 5b schematically depicts an aspect of a particulate luminescent material;

FIG. 5c schematically depicts an aspect of a particulate luminescent material;

DETAILED DESCRIPTION OF THE PREFERRED EMBODIMENTS

Figure 1A:
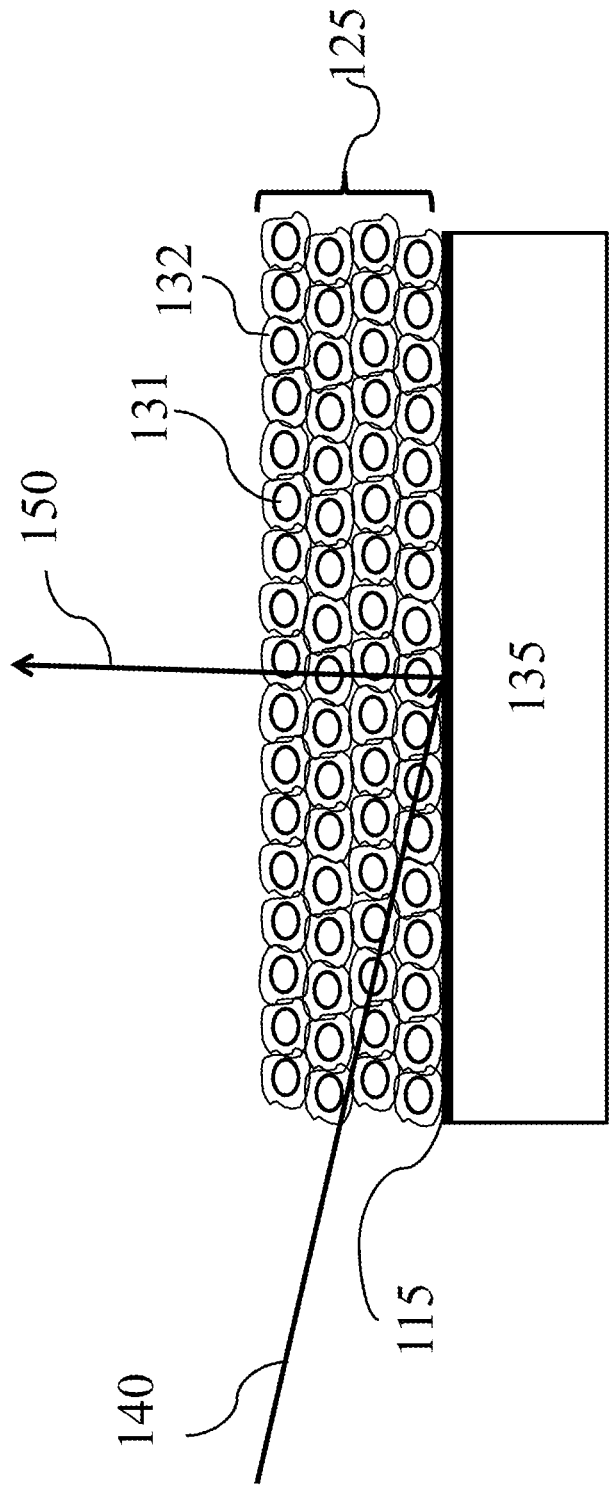
FIG. 1a shows a cross-sectional view of light being absorbed and emitted by a three dimensional film with an off axis excitation.

An inorganic coating can be used as a bonding mechanism and may be used to bond particles together to create three dimensional films that may have some degree of porosity depending on the packing density of the particles and the degree of gap filling, to bond particles to a component, including a light emitter, to bond a component to another component, or for like purposes. The inorganic coating may provide benefits, over alternatives, such as improved reliability, decreased cost, generation of a transparent or semi-transparent film, coefficient of thermal expansion (CTE) matching, index of refraction, or the like. Particles coated with inorganic material may experience additional benefits such as a higher resistance to moisture.

According to implementations of the disclosed subject matter, optically scattering particles (also including and referred to as luminescent particles herein) can be bonded together via an inorganic coating applied using a low-pressure deposition technique to create a three dimensional film. The porous three-dimensional film may be a scattering film and may be freestanding or bonded to a component such as a substrate, a light emitting device, ceramic phosphor, or the like. Excitation including photoexcitation, such as from an LED or laser may be used to excite all or a portion of the three dimensional film. Other forms of excitation may include cathodoluminescence from an electron beam source, radioluminescence from an X-ray source, or electroluminescence from an applied electromagnetic field. As a result, a converted emission may exit the three-dimensional film from the same side that the excitation entered or from a different side than from which the excitation entered. The emitted light may be the converted emission or a combination of the converted emission and photoexcitation light where, preferably, the emitted light has a desired correlated color temperature (CCT) with a particular color-rendering index (Ra). Further, the light photoexcitation entering the three-dimensional film may experience a scattering effect due to interaction with portions of the three-dimensional film.

According to implementations of the disclosed subject matter, a plurality of optically scattering particles may be bonded via an inorganic coating applied to the particles or agglomeration of particles. The particles may be composed of one or more applicable luminescent or optically scattering material such as phosphor particles with or without activation from rare earth ions, aluminum nitride, aluminum oxynitride (AlON), barium sulfate, barium titanate, calcium titanate, cubic zirconia, diamond, gadolinium gallium garnet (GGG), lead lanthanum zirconate titanate (PLZT), lead zirconate titanate (PZT), sapphire, silicon aluminum oxynitride (SiAlON), silicon carbide, silicon oxynitride (SiON), strontium titanate, titanium oxide, yttrium aluminum garnet (YAG), zinc selenide, zinc sulfide, and zinc telluride, diamond, silicon carbide (SiC), single crystal aluminum nitride (AlN), gallium nitride (GaN), or aluminum gallium nitride (AlGaN) or any transparent, translucent, or scattering ceramic, optical glass, high index glass, sapphire, alumina, III-V semiconductors such as gallium phosphide, II-VI semiconductors such as zinc sulfide, zinc selenide, and zinc telluride, group IV semiconductors and compounds, metal oxides, metal fluorides, an oxide of any of the following: aluminum, antimony, arsenic, bismuth, calcium, copper, gallium, germanium, lanthanum, lead, niobium, phosphorus, tellurium, thallium, titanium, tungsten, zinc, or zirconium, polycrystalline aluminum oxide (transparent alumina), aluminum oxynitride (AlON), cubic zirconia (CZ), gadolinium gallium garnet (GGG), gallium phosphide (GaP), lead zirconate titanate (PZT), silicon aluminum oxynitride (SiAlON), silicon carbide (SiC), silicon oxynitride (SiON), strontium titanate, yttrium aluminum garnet (YAG), zinc sulfide (ZnS), spinel, Schott glass LaFN21, LaSFN35, LaF2, LaF3, LaF10, NZK7, NLAF21, LaSFN18, SF59, or LaSF3, Ohara glass SLAM60 or SLAH51, and may comprise nitride luminescent material, garnet luminescent material, orthosilicate luminescent material, SiAlON luminescent material, aluminate luminescent material, oxynitride luminescent material, halogenide luminescent material, oxyhalogenide luminescent material, sulfide luminescent material and/or oxysulfide luminescent material, and luminescent quantum dots comprising core materials chosen from cadmium sulfide, cadmium selenide, zinc sulfide, zinc selenide, and may be chosen form $SrLiAl_3N_4$:Eu (II) (strontium-lithium-aluminum nitride:europium (II)) class, or any combination thereof.

The size of the luminescent or optically scattering particles may depend on the application of the particles in a light emitting or like system. The size may be between a nanometer to 100 μm $D_{50}$ or between 1 μm and 50 μm $D_{50}$ or 3 μm to 30 μm $D_{50}$ or 5 μm to 25 μm $D_{50}$ or 7 μm to 20

μm $D_{50}$. Here, D represents the diameter of powder particles, and $D_{50}$ means a cumulative 50% point of diameter (or 50% pass particle size) and may also be referred to as an average particle size or median diameter. Nano sized to 5 μm phosphor particles can be suitable for micro LED pixel coverage, whereas 5 to 25 μm particle sizes are more suitable for a higher power LED having a millimeter square area or more.

According to implementations of the disclosed subject matter, a plurality of optically scattering particles may be deposited onto a component. The component may be composed of one or more applicable material such as diamond, silicon carbide (SiC), single crystal aluminum nitride (AlN), gallium nitride (GaN), or aluminum gallium nitride (AlGaN), aluminum indium gallium nitride (AlInGaN), optical glass, high index glass, sapphire, diamond, silicon carbide, alumina, III-V semiconductors such as gallium phosphide, II-VI semiconductors such as zinc sulfide, zinc selenide, and zinc telluride, group IV semiconductors and compounds, metal oxides, metal fluorides, an oxide of any of the following: aluminum, antimony, arsenic, bismuth, calcium, copper, gallium, germanium, lanthanum, lead, niobium, phosphorus, tellurium, thallium, titanium, tungsten, zinc, or zirconium, polycrystalline aluminum oxide (transparent alumina), aluminum oxynitride (AlON), cubic zirconia (CZ), gadolinium gallium garnet (GGG), gallium phosphide (GaP), lead lanthanum zirconate titanate (PLZT), lead zirconate titanate (PZT), silicon aluminum oxynitride (SiAlON), silicon carbide (SiC), silicon oxynitride (SiON), strontium titanate, yttrium aluminum garnet (YAG), zinc sulfide (ZnS), spinel, Schott glass LaFN21, LaSFN35, LaF2, LaF3, LaF10, NZK7, NLAF21, LaSFN18, SF59, or LaSF3, Ohara glass SLAM60 or SLAH51, or any combination thereof, aluminum oxynitride (AlON), polycrystalline alumina oxide (transparent alumina), aluminum nitride, cubic zirconia, diamond, gallium nitride, gallium phosphide, sapphire, silicon carbide, silicon aluminum oxynitride (SiAlON), silicon oxynitride (SiON), spinel, zinc sulfide, or an oxide of tellurium, lead, tungsten, or zinc. The component may be any applicable component such as a metal, a substrate, a ceramic, a semiconductor, a light emitting device, an insulator, or the like.

The particles may be deposited using any applicable technique such as sedimentation, EPD, stenciling, dispensing in a volatile medium, or the like.

According to implementations of the disclosed subject matter, an inorganic coating may be applied to the plurality of optically scattering particles. The coating material may be selected from the same list of materials that may make up the optically scattering particles or substrates, or other applicable materials such as aluminum oxide $Al_2O_3$, hafnium oxide $HfO_2$, tantalum oxide $Ta_2O_5$, titanium oxide $TiO_2$, zirconium oxide $ZrO_2$, another transparent oxide, or the like. The coating may be single layered or be multi layered of the same or different material, and may be applied by depositing a material at the particle surface by deposition from the gas phase, such as via an atomic layer deposition (ALD) process. Atomic layer deposition could be a suitable method to deposit thin, conformal coatings of various inorganic materials on powder particles. For instance, methods may be used to fluidize particles during the ALD coating process to improve the coating quality by preventing particle-particle agglomeration that leads to decreased coating quality.

The coating may be an oxide, nitride, carbide, arsenide, phosphide, fluoride, sulfide, selenide, telluride, metal, single element, or tellurite glass. The coating may be any of the materials or combination of materials listed for the particles or substrates. The thickness of the inorganic coating may be determined, at least in part, by the size of optically scattering particles bonded by the inorganic coating. Larger particles require a thicker inorganic coating and, accordingly, smaller particles may result in a thinner inorganic coating. According to implementations, the inorganic coating may be as thin as a single monolayer of around 3 Angstroms to as thick as 1000 Angstroms that is $1/10^{th}$ of a micron, be between $1/10^{th}$ of a micron to 1 micron, or be between 1 micron and 10 microns, or the like.

The plurality of optically scattering particles 131 may be bonded together by the inorganic coating 132 deposited onto the plurality of particles as shown in FIGS. 1a-1d. The particles may be bonded using a low pressure or low partial pressure deposition where coating materials have a large diffusion length that penetrate deeply, such as CVD, low pressure CVD, ALD, or the like. The inorganic coating may create a bond that binds the plurality of particles together in either a freestanding three-dimensional film or over a component such as a substrate or LED. The inorganic coating may also bind the three-dimensional particle film to the component such as a substrate or LED.

Figure 1B:
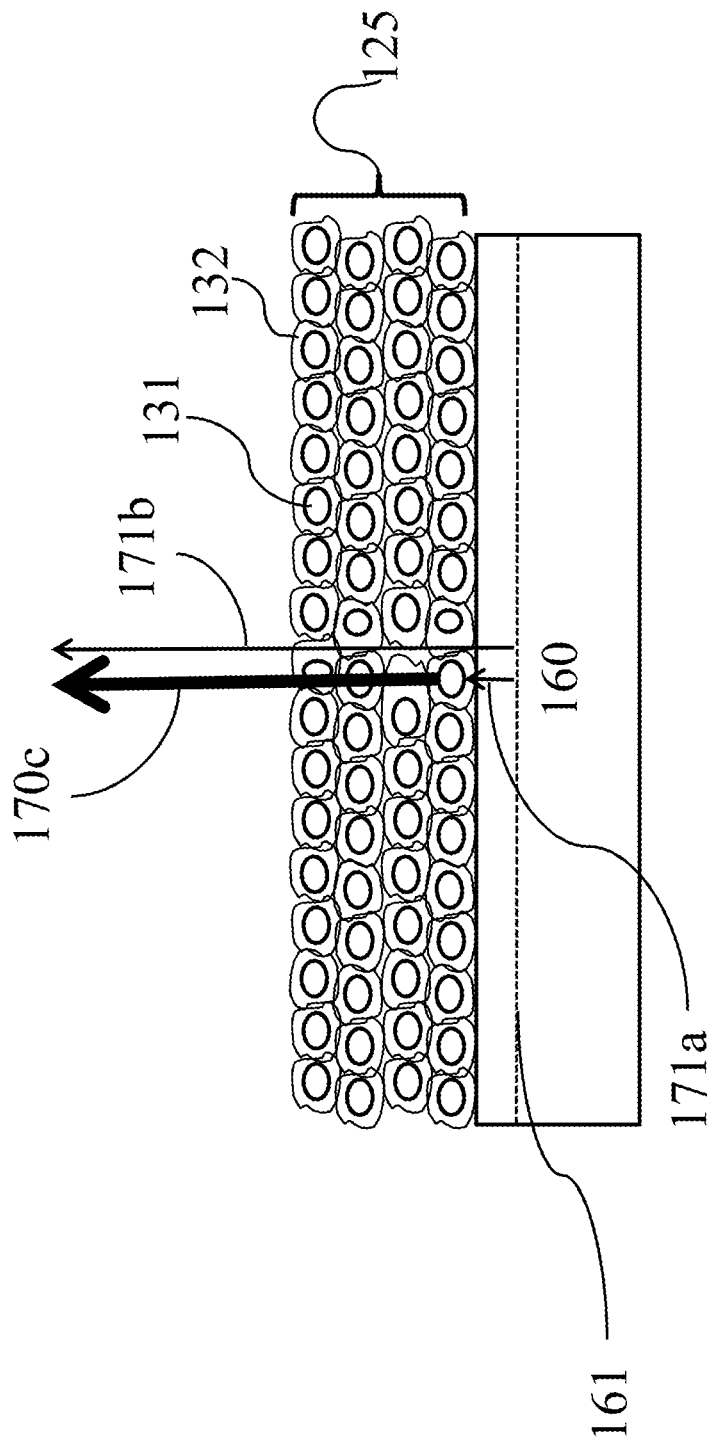
FIG. 1b shows a cross-sectional view of light being emitted by a light emitting device and absorbed and converted through a three dimensional film.

As shown in FIG. 1b, the optically scattering particles 131 bonded together via the inorganic coating 132 to produce a three dimensional film 125 may be over an LED 160. The LED 160 may emit a light 171a and 171b from a light emitting layer or region 161 which traverses through the three dimensional film 125 and exits from the surface opposite to the LED 160. As shown via the distinctive arrows, a portion of the light emitted by the LED 160, 171a, may be absorbed by a optically scattering particle 131 and a portion of the light, 171b may pass through the three dimensional film 125 without being absorbed by an optically scattering particle. Light 171a, which is absorbed by a luminescent scattering particle 131, may be converted to a different wavelength light by the luminescent particle or phosphor. A converted light 170c may exit the three dimensional film 125 such that the light 170c is combined with the light 171b to form the device emission, and the combined light is the desired light emission from the three dimensional film 125. For example, some of blue light emitted by the LED may be converted to yellow and the combined blue and yellow light make a light that appears white. An additional phosphor that converts to the red may be added for a warmer white (lower CCT) and better color rendering (higher Ra). Alternatively, an UV LED could be used with a blue and yellow phosphor, where the UV is fully absorbed. Also, a third red phosphor could be added for a warmer white and better color rendition. An amber LED device may be created by using an amber phosphor with blue or UV LED for full wavelength conversion to an amber emission.

Figure 1C:
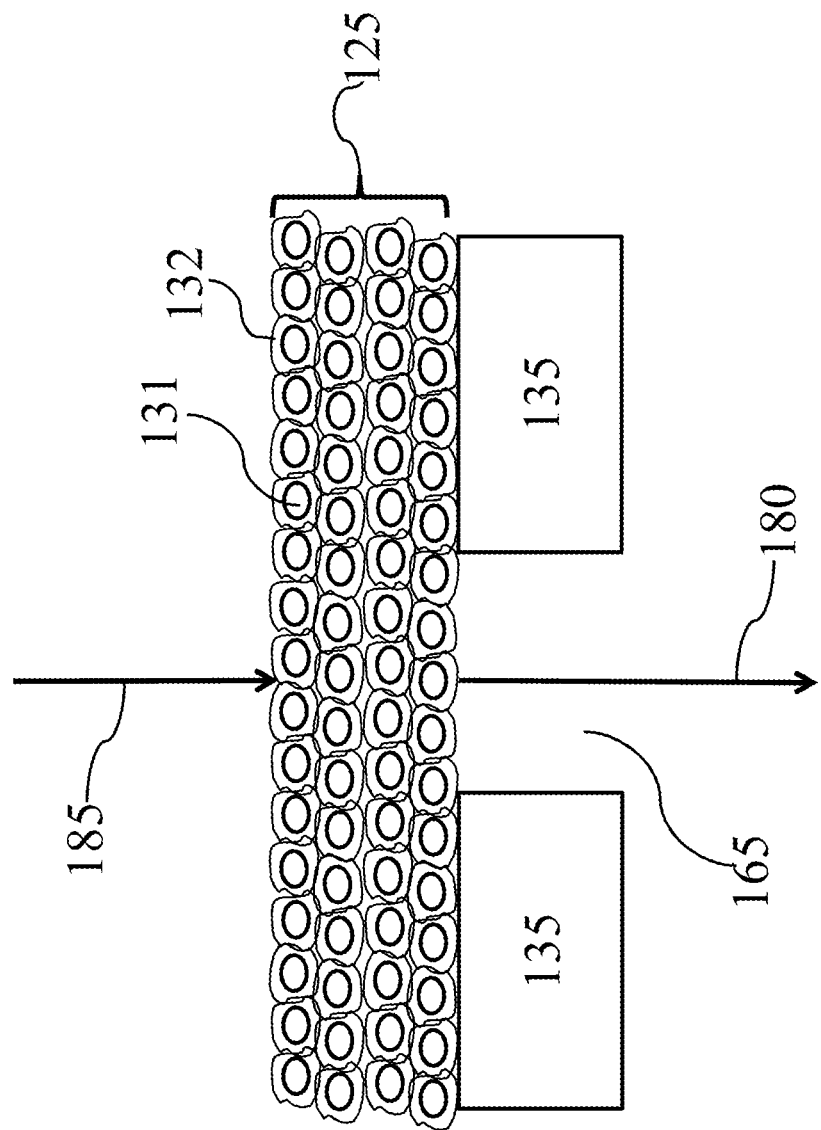
FIG. 1c shows a cross-sectional view of light being absorbed and converted through a three dimensional film.
Figure 1D:
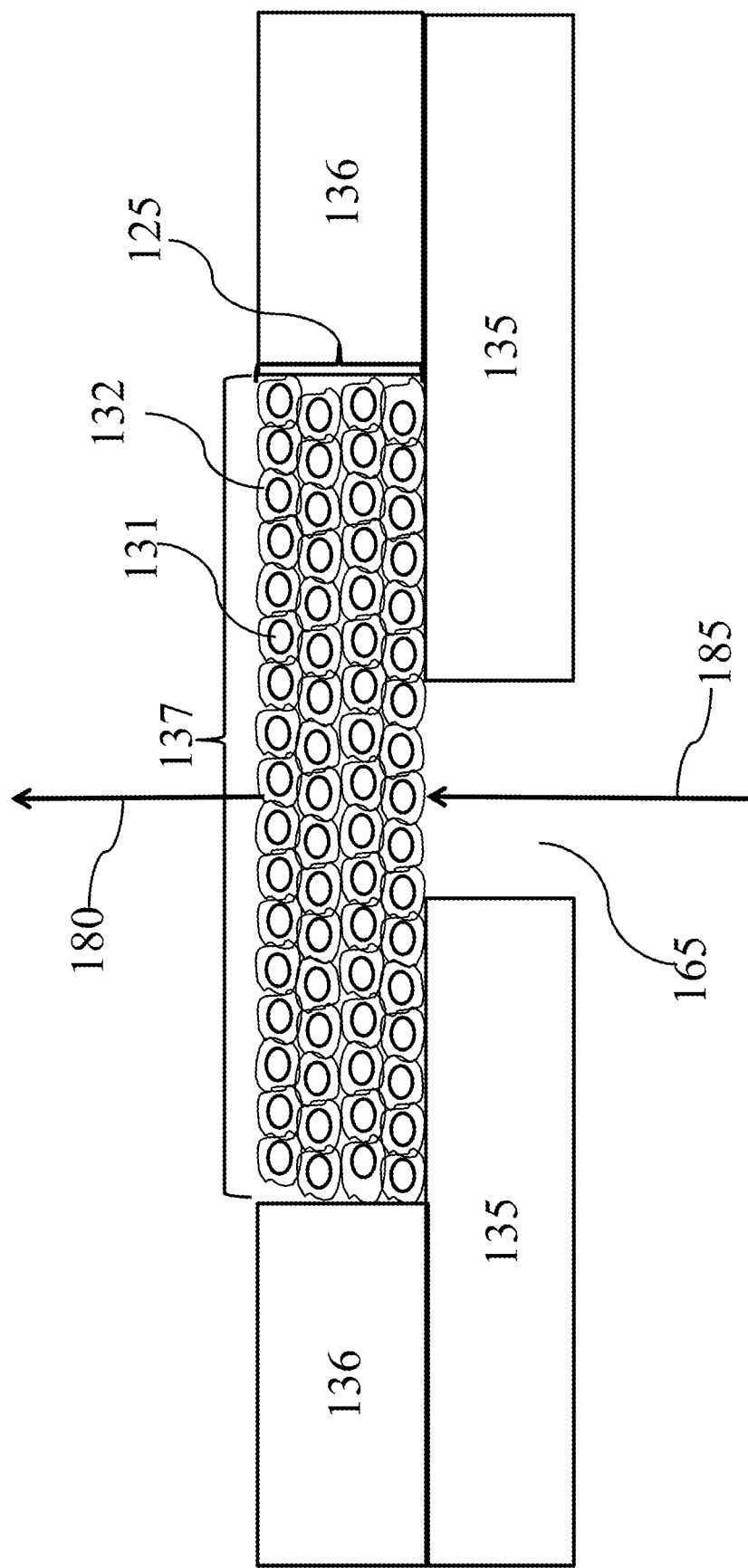
FIG. 1d shows a cross-sectional view of light being absorbed and converted through a three-dimensional film surrounded, in part, by spacer material.

According to an implementation, a portion of the inorganic coating may be in contact with a particle A and a particle B such that it both coats the two particles A and B and also bonds them together. Alternatively, according to implementations of the disclosed subject matter, a portion of the three-dimensional film may rest on a component including a substrate while another portion of the film is freestanding. The freestanding portion of the film may allow light excitation to enter from one side and an emission to escape from another side. For example on a substrate with multiple areas removed and a freestanding portion of the film bridging the gapped area, an array of pixels may be formed. In an illustrative example, as shown in FIG. 1c, a portion of the substrate 135 may be removed to create a gap, 165. The three-dimensional film 125 may rest on the remaining portions of substrate 135. A light excitation 185 may be sent towards the three-dimensional film from a light-emitting device located on one side of the substrate. The light excitation 185 may be absorbed, at least in part, by the bonded particles 131 of three-dimensional film 125 and a light emission 180 may escape the three-dimensional film 125 from a side opposite from the side where the light excitation 185 entered the three-dimensional film 125. The substrate may be thermally conductive and reflective, such as a metal for example silver or aluminum, or a diffuse reflective material, such as boron nitride. Alternatively the substrate may be a thermally conductive and absorptive material, such as pyrolytic graphite. Having either a reflective or absorptive substrate with good thermal conductivity may be useful in reducing cross talk between pixels in a raster scanned laser system having high optical power densities. Alternatively as depicted in FIG. 1d the optically scattering particles/luminescent particles can be deposited in recesses 137 of a substrate 136 with 135 and, optionally, at least a portion of the opposite side of the substrate 135 can be removed to expose the three-dimensional film for transmitting the radiation, otherwise in the former case excitation radiation may be introduced on the same side. For this case the material of the substrate 136 or spacer or separation material 136 attached to 135 may be reflective or absorptive and the substrate 135 or spacer material attached to substrate 135 may be reflective or absorptive. The material 136 and 135 may be the same with recess or cavity 137 formed in it, for example 135/136 may be a silicon wafer with recesses 137 etched in it. Alternatively, 136 can be an additional layer of the same or different material on 135. For example, substrate 135 can be boron nitride with a spacer or separation material 136 being a layer of pyrolytic graphite having recesses or cavities 137 formed before or after placement on substrate 135.

It will be understood by one skilled in the art that optically scattering particles may be disposed on a component prior to being bonded via an inorganic coating, as provided in the implementations thus far, or may be bonded via an inorganic coating and then deposited onto a component. In another embodiment, the particles can be coated first and then be bonded together in aggregate. This can be done with a subsequent ALD coating or if the original coating has a low enough softening temperature, a thermal treatment may bind the coated particles together.

A three-dimensional film may be configured to receive a light of a first wavelength. As a result of the absorption of this excitation light by one or more optically scattering/luminescent particles, portions of the received light may be converted to a different light with a second wavelength. Depending on the characteristics of the three-dimensional film or the particles, or both, the light emission may contain light of the second wavelength or light that is a combination of the first wavelength (e.g., where the original light may not have been absorbed by a particle in the three-dimensional film and passed or reflected through the film) and the second wavelength. As an example, a three-dimensional film may receive a blue light and the three-dimensional film may convert part of the blue light to emit a yellow light. The overall light emission through the three-dimensional film may be a combination of the blue light and converted yellow light, providing an effective white light as a result.

The coefficient of thermal expansion (CTE) of the coating may be nearly matched to that of the optically scattering particles. Alternatively or in addition, the CTE of the coating may be nearly matched to that of the component on which the particles are disposed or with which an inorganic coating is used to form a bond to the three dimensional film or other component, as disclosed herein.

The index of refraction of the coating may be nearly matched to that of the optically scattering or luminescent particles. Alternatively or in addition, the index of refraction of the coating may be nearly matched to that of the index of refraction of a transparent component on which the particles are disposed or with which an inorganic coating is used to form a bond to the three dimensional film or other component, as disclosed herein. Alternatively, the index of refraction of the coating may be lower than that of the optically scattering or luminescent particles. In this case the individual particles in the agglomerate retain some of their scattering properties. If the index of refraction of the coating matches the particles than the scattering of the individual particles is lost and the scattering properties of the porous three-dimensional film becomes the prominent scattering mechanism. If multiple particle materials are used such as a garnet phosphor and a nitridosilicate phosphor, the index of refraction of the coating may match the index of refraction of the garnet, but the nitridosilicate phosphor may still scatter because of its higher index of refraction. For example an alumina coating will have an index of refraction that is nearly matched to a garnet phosphor (green or yellow) at around 1.8, whereas the index of refraction of the nitridosilicate phosphor (red) is around 2.2.

Figure 2:
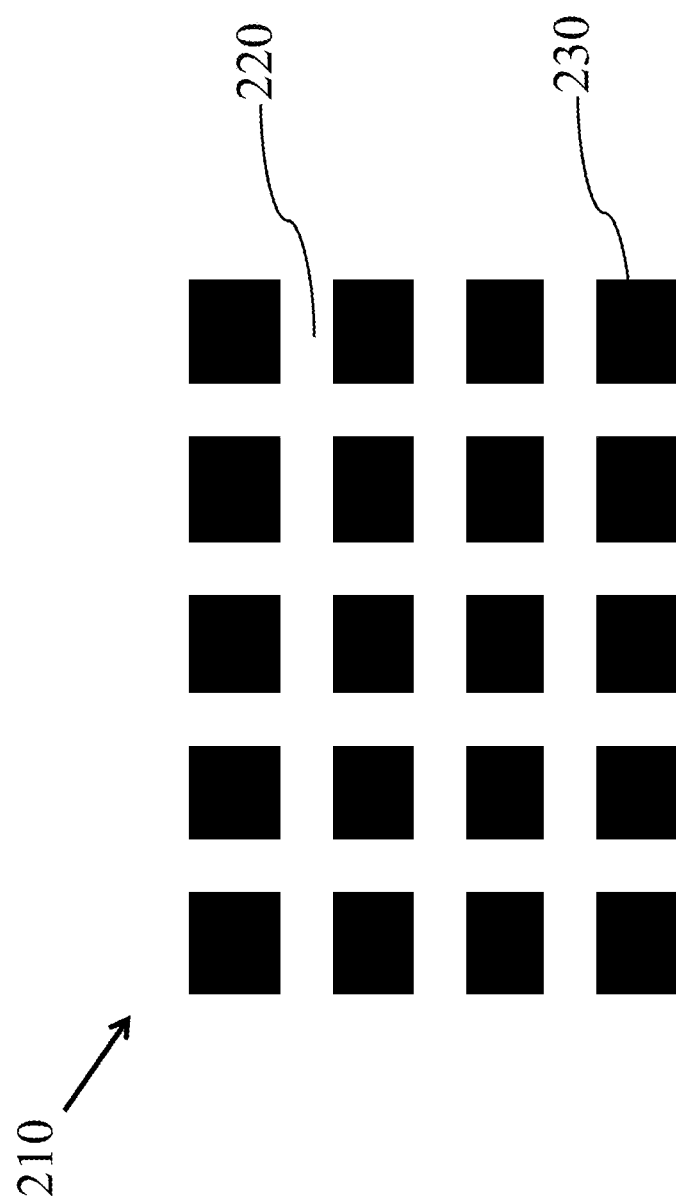
FIG. 2 shows a top sectional view of an arrangement of three-dimensional films.

According to an implementation of the disclosed subject matter, multiple three-dimensional films may be arranged adjacent to each other such that a spacer or separation layer separates each pixel. The separation layer may be, for example, an absorptive layer or a reflective layer and may be configured for high contrast with low cross talk and high efficiency. An absorptive layer may be composed of any applicable absorptive material such as silicon or pyrolytic graphite and a reflective layer may be any applicable reflective material such as specular silver, diffusive reflective boron nitride, a loaded silicone with for example $TiO_2$, an epoxy molding compound, or other white molding compounds. As an example, as shown in FIG. 2, multiple three-dimensional films 230 may be arranged in a matrix or pixelated pattern 210. A reflective or absorptive layer 220 may separate each film that can also be the spacer or substrate in cross sectional FIG. 1d. The reflective or absorptive layer may serve to keep light emitted by the multiple three-dimensional films separate from each other and to visually maintain the pixelated pattern with reduced cross talk. According to an implementation, multiple light emitting devices may be placed underneath the multiple three-dimensional films that are separated by a separation layer. The multiple devices may be individually addressable and emit light towards one or more specific pixel films when activated such that the light emission through the one or more three-dimensional films can be more distinctly controlled. As an example, an automotive headlight may contain multiple LEDs disposed underneath a pixel-patterned group of three-dimensional films, which are separated from each other by a separation material. The matrix may contain 2, 3, 5, 10s, to 100s of pixels for a camera flash. The matrix may contain, for example, 1000, 5000, or 10000 pixels for an automotive adaptive front lighting system (AFS) and many times this number for a display. Where millions of pixels are required for an application, a raster scanned laser may be used. Raster scanning may be accomplished with a microelectromechanical system (MEMS) based mirror or with an acousto-optic reflector or deflector. AFS can be used to level the beam of a headlamp when a vehicle is heavily loaded, climbing or descending a hill or valley, traversing a rough or undulating road, steering the beam around curves and turns, creating a projection pattern that creates a hole in illumination so that drivers of oncoming vehicles and vehicles ahead traveling in the same direction are not blinded or dazzled. U.S. Pat. Nos. 6,406,172 and 7,566,155 are hereby incorporated herein, in their entirety, by reference. For example, the left column of three-dimensional films and the respective LEDs beneath them may default to being off. Upon receiving a signal that the steering wheel of the automobile is turned by over 30% of its travel counter clockwise, the LEDs beneath the left column of three-dimensional films may be switched to on, and emit a light towards the left column of three-dimensional films. The left column of three-dimensional films may receive the light excitation and emit a light from the headlight of the automobile such that the emitted light illuminates a scene further left than the scene originally illuminated by the headlight before the 30% counterclockwise travel of steering wheel turn was reached. An advantage of using such an arrangement is that the headlight need not contain moving components to provide turn-based illumination. AFS systems may be far more complex than the simple system described above and employ cameras, light detection and ranging (LiDAR), image processors, and controllers. Infrared (IR) LEDs or vertical cavity surface emitting lasers (VCSELs) may provide supplemental light and information to the sensors and detectors. Such systems of image detection and processing can anticipate road topology, sense vehicle and pedestrian traffic to provide optimal lighting for the vehicle driver. Vehicle to vehicle, infrastructure, pedestrian, target, or object (V2X) communications may be used to provide position, speed, vehicle type and dimensions, etc. to adaptive front, rear, and side exterior lighting systems. A component with a desired thermal conductivity, for example, diamond, copper, silver, or a combination thereof, may be used as a heat sink. In the example provided herein, a substrate with a desirable thermal conductivity may be used as a heat sink in an automotive laser headlamp or other adaptive lighting system as the optically scattering/luminescent particles, such as phosphor, may be excited at high power densities by the laser beam, creating a need for a heat sink. Secondary optics such as a parabolic reflector and imaging lens may be employed. The matrix or pixelated light source may lie on a reflective planar surface with a half parabolic reflector overlaying the reflective planar surface with an imaging or projector lens in the reflected light optical path.

According to implementations of the disclosed subject matter, a reflective coating may be in contact with or in the optical path of one or more sides of a three-dimensional film. As an example, a reflective and thermally conductive mirror could be disposed between the three-dimensional film and a substrate. As shown in FIG. 1a, a light 140 may be emitted towards a three-dimensional film 125, which includes bonded phosphor particles 131. The wavelength of at least a portion of the light may be converted within the three-dimensional film 125 and the light may reach a reflective layer 115, which is disposed over the top of substrate 135. The light may reflect off the reflective layer 115 and exit the three-dimensional film from the same side it entered from. Similarly, a filter, such as a wavelength selective filter may be in contact with or in the optical path of one or more sides of the three dimensional film. As an example, a filter on the emission exit surface or emission side of the three-dimensional film 125 (not shown) may be more reflective of blue light and more transmissive to longer wavelength light such as green, yellow and red light. Based on the desired result, filtering the light using this filter may improve wavelength conversion efficiency. U.S. Pat. No. 9,543,478 is hereby incorporated herein in its entirety by reference. A reflective coating and/or filter may be a distributed Bragg reflector (DBR) or a dichroic made of alternating layers of different index materials such as dielectrics. The reflective coating and/or filter may also include a metal layer such as one made at least in part of silver (Ag) and can include additional metal oxides or dielectrics such as TiW or TiWNx layer. A bandpass filter, for example a neodymium Nd coating may be used. An example of a DBR or dichroic filter may be alternating layers of $Nb_2O_5$, $SiO_2$, $TiO_2$ and any other suitable material. The thickness may be at least 10 nm in some embodiments, no more than 5 microns thick in some embodiments, at least 1 micron thick in some embodiments and no more than 2 microns thick in some embodiments. The total number of layers may be at least 2 layers in some embodiments, no more than 50 layers in some embodiments, at least 10 layers in some embodiments and no more than 30 layers in some embodiments. Each layer may be the same thickness or layers of different thickness may be used. The filter may be deposited by any suitable technique including sputtering, plasma vapor deposition, chemical vapor deposition, and evaporation. The filter may be between the excitation source and the three-dimensional converter film, on the emission side of the three-dimensional converter film if these surfaces are different, or on one or more sides of the three-dimensional converter film. For very high luminance (small etendue) applications the large top and/or bottom areas of the three-dimensional converter film can be pumped with other un-pumped surfaces having a reflector and emission extracted from one or more edges.

According to implementations of the disclosed subject matter, an inorganic coating, as described herein, may bond a component to another component where a component could be a substrate, an LED, a ceramic phosphor, ceramic, metal, insulator, semiconductor, or other light emitting device, or the like. The surface of one or both of the components that are being bonded may be treated to allow for the inorganic coating precursors to more easily access the bonding area of the components. The treatment may be a roughening of the surface of one or both components that the inorganic coating will bond. Alternatively or in addition, groves may be added to the surface of one or both components to enable the inorganic coating to penetrate the surface. As an example, a ceramic phosphor may be bonded to a light emitter or to another ceramic phosphor, or to a substrate. The coefficient of thermal expansion (CTE) of the ceramic phosphor and or index of refraction may be nearly matched to that of the component being bonded to the ceramic phosphor. Surface roughness and/or groves may be formed on one or more of the surfaces that will be bonded, to enable the ALD coating to penetrate.

Figure 3:
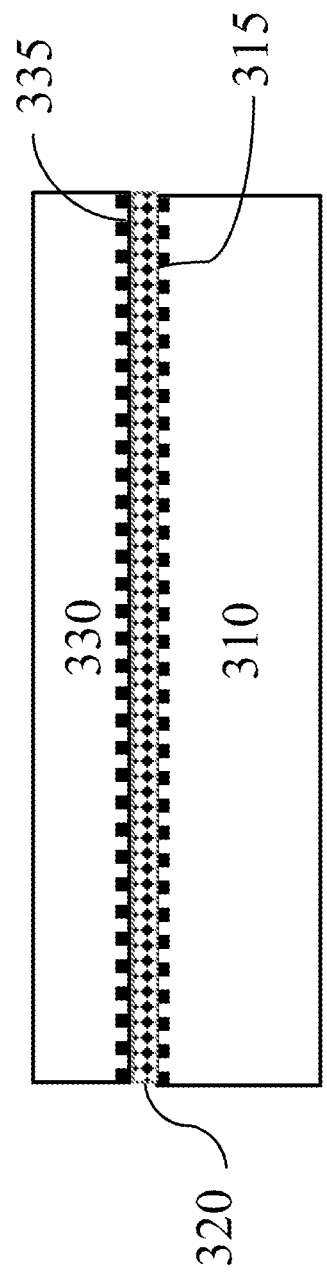
FIG. 3 shows two components bonded via an inorganic coating.

As shown in FIG. 3, a substrate 310 may be bonded to a ceramic phosphor plate 330 via an inorganic coating 320. The two surfaces to be bonded together may be treated such that surface 315 corresponding to the substrate 310 and surface 335 corresponding to the ceramic phosphor plate 330 may be roughened. The roughened surface may allow the inorganic coating 320 to penetrate the entire respective bonding surfaces during the ALD process. After the treatment process, the inorganic coating 320 may be applied to the two surfaces 315 and 335 via a low-pressure deposition technique such as the ALD process. The inorganic coating then bonds the two surfaces 315 and 335 together, resulting in a structure where substrate 310 is bonded to the ceramic phosphor plate 330 via the inorganic coating.

According to implementations of the disclosed subject matter, a ceramic phosphor plate may be composed of $Y_3Al_5O_{12}:Ce^{3+}$. The ceramic phosphor plate may be an amber to red emitting rare earth metal-activated oxonitrido-alumosilicate of the general formula $(Ca_{1-x-y-z}Sr_xBa_yMg_z)_{1-n}(Al_{1-a+b}B_a)Si_{1-b}N_{3-b}O_b:RE_{n3}$ wherein $0 \leq x \leq 1$, $0 \leq y \leq 1$, $0 \leq z \leq 1$, $0 \leq a \leq 1$, $0 \leq b \leq 1$ and $0.002 \leq n \leq 0.2$, and RE may be selected from europium(II) and cerium(III). The phosphor in the ceramic phosphor plate may also be an oxido-nitrido-silicate of general formula $EA_{2-z}Si_{5-a}B_aN_{8-a}O_a:Ln_z$, wherein $0 \leq z \leq 1$ and $0 < a < 5$, including at least one element EA selected from the group consisting of Mg, Ca, Sr, Ba and Zn and at least one element B selected from the group consisting of Al, Ga and In, and being activated by a lanthanide (Ln) selected from the group consisting of cerium, europium, terbium, praseodymium and mixtures thereof.

The ceramic phosphor plate may also be an aluminum garnet phosphors with the general formula $(Lu_{1-x-y-a-b}Y_xGd_y)_3(Al_{1-z}Ga_z)_5O_{12}:Ce_aPr_b$, wherein $0 < x < 1$, $0 < y < 1$, $0 \leq z \leq 0.1$, $0 < a \leq 0.2$ and $0 \leq b \leq 0.1$, such as $Lu_3Al_5O_{12}:Ce^{3+}$ and $Y_3Al_5O_{12}:Ce^{3+}$, which emits light in the yellow-green range; and $(Sr_{1-x-y}Ba_xCa_y)_{2-z}Si_{5-a}Al_aN_{8-a}O_a:Eu_z^{2+}$, wherein $0 \leq a < 5$, $0 \leq x \leq 1$, $0 \leq y \leq 1$, and $0 \leq z \leq 1$ such as $Sr_2Si_5N_8:Eu^{2+}$, which emits light in the red range. Other green, yellow and red emitting phosphors may also be suitable, including $(Sr_{1-a-b}Ca_bBa_c)Si_xN_yO_z:Eu^{2+}$; ($a=0.002-0.2$, $b=0.0-0.25$, $c=0.0-0.25$, $x=1.5-2.5$, $y=1.5-2.5$, $z=1.5-2.5$) including, $SrSi_2N_2O_2:Eu^{2+}$; $(Sr_{1-u-v-x}Mg_uCa_vBa_x)(Ga_{2-y-z}Al_yIn_z S_4):Eu^{2+}$ including, for example, $SrGa_2S_4:Eu^{2+}$; $Sr_{1-x}Ba_xSiO_4:Eu^{2+}$; and $(Ca_{1-x}Sr_x)S:Eu^{2+}$ wherein $0 \leq x \leq 1$ including, $CaS:Eu^{2+}$ and $SrS:Eu^{2+}$. Other suitable phosphors include, $CaAlSiN_3:Eu^{2+}$, $(Sr,Ca)AlSiN_3:Eu^{2+}$, and $(Sr, Ca, Mg, Ba, Zn)(Al, B, In, Ga)(Si, Ge)N_3:Eu^{2+}$.

The ceramic phosphor plate may also have a general formula $(Sr_{1-a-b}Ca_bBa_cMg_dZn_e)Si_xN_yO_z:Eu_a^{2+}$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 \leq z \leq 2.5$. The ceramic phosphor plate may also have a general formula of MmAaBbOoNn:Zz where an element M is one or more bivalent elements, an element A is one or more trivalent elements, an element B is one or more tetravalent elements, O is oxygen that is optional and may not be in the phosphor plate, N is nitrogen, an element Z that is an activator, $n=2/3m+a+4/3b-2/3o$, wherein m, a, b can all be 1 and o can be 0 and n can be 3. M is one or more elements selected from Mg (magnesium), Ca (calcium), Sr (strontium), Ba (barium) and Zn (zinc), the element A is one or more elements selected from B (boron), Al (aluminum), In (indium) and Ga (gallium), the element B is Si (silicon) and/or Ge (germanium), and the element Z is one or more elements selected from rare earth or transition metals. The element Z is at least one or more elements selected from Eu (europium), Mg (manganese), Sm (samarium) and Ce (cerium). The element A can be Al (aluminum), the element B can be Si (silicon), and the element Z can be Eu (europium).

The ceramic phosphor plate may also be an $Eu^{2+}$ activated Sr—SiON having the formula $(Sr_{1-a-b}Ca_bBa_c)Si_xN_yO_x:Eu_a$, wherein $a=0.002-0.2$, $b=0.0-0.25$, $c=0.0-0.25$, $x=1.5-2.5$, $y=1.5-2.5$.

The ceramic phosphor plate may also be a chemically-altered Ce:YAG (Yttrium Aluminum Garnet) phosphor that is produced by doping the Ce:YAG phosphor with the trivalent ion of praseodymium (Pr). The ceramic phosphor plate may include a main fluorescent material and a supplemental fluorescent material. The main fluorescent material may be a Ce:YAG phosphor and the supplementary fluorescent material may be europium (Eu) activated strontium sulfide (SrS) phosphor ("Eu:SrS"). The main fluorescence material may also be a Ce:YAG phosphor or any other suitable yellow-emitting phosphor, and the supplementary fluorescent material may also be a mixed ternary crystalline material of calcium sulfide (CaS) and strontium sulfide (SrS) activated with europium $((Ca_xSr_{1-x})S:Eu^{2+})$. The main fluorescent material may also be a Ce:YAG phosphor or any other suitable yellow-emitting phosphor, and the supplementary fluorescent material may also be a nitrido-silicate doped with europium. The nitrido-silicate supplementary fluorescent material may have the chemical formula $(Sr_{1-x-y-z}Ba_xCa_y)_2Si_5N_8:Eu_z^{2+}$ where $0 \leq x$, $y \leq 0.5$ and $0 \leq z \leq 0.1$.

The ceramic phosphor plate may also have a blend of any of the above described phosphors. More information can be found in U.S. Pat. Nos. 7,462,502, 7,419,839, 7,544,309, 7,361,938, 7,061,024, 7,038,370, 6,717,353, and 6,680,569, and U.S. Pat. App. Pub. No. 20060255710, which are commonly assigned and incorporated by reference in their entirety.

Implementations of the disclosed subject matter may be applied to any applicable lighting device or system such as an automotive lighting component including headlights, tail lights, and the like, flash lighting, LEDs, programmable lighting systems, and the like.

According to implementations of the disclosed subject matter, an ALD process may be used to coat a particle and may also be used to form a coating configured to bond multiple particles together. The following disclosure is associated with the ALD process along with hybrid processes such as a sol-gel process followed by an ALD process, which may be incorporated by the implementations disclosed herein. Although the following disclosure may generally be related to coating individual particles, one of skilled in the art shall understand that some of the processes, as described in WO2016041838A1 and herein, can be utilized when generating the three-dimensional films bonded via inorganic coatings.

A method for providing luminescent particles with a hybrid coating is provided, and includes: (i) providing a first coating layer ("first coating" or "sol-gel coating" or "sol-gel coating layer") onto the luminescent particles by application of a sol-gel coating process, thereby providing coated luminescent particles; and (ii) providing a second coating layer ("second coating" or "ALD coating" or "ALD coating layer") onto the coated luminescent particles by application of an atomic layer deposition process, especially a method wherein the second coating layer comprises a multilayer with layers having different chemical compositions, and wherein in the atomic layer deposition process a metal oxide precursor is, amongst others, selected from the group of metal oxide precursors of metals chosen from aluminum, hafnium, tantalum, zirconium, titanium, and silicon. The metal oxide precursors may include, trimethylaluminum, tetrakis (dimethylamino) hafnium, tetrakis (diethylamino) hafnium, tetrakis (methyl-ethyl amino) hafnium, tantalum chloride, pentakis (dimethylamino) tantalum, (t-butylamino) tris (methyl ethyl amino) tantalum, zirconium tetrachloride, tetrakis(dimethylamino) zirconium, tetramethoxy titanium, tetraethoxy titanium, silicon tetrachloride, (3-aminopropyl) triethoxysilane, tetraethoxy silane and oxygen source may be chosen from water and ozone ($O_3$). The layers in multi-layers may comprise aluminum oxide, hafnium oxide, zirconium oxide, titanium oxide and silicon dioxide, preferably tantalum pentoxide and aluminum oxide. As shown in FIGS. 5a, 5b and 5c, a luminescent core 102 comprises non-oxide, and an intermediate oxide layer is present between the luminescent core 102 and the coating layer 135. A sol-gel coating, involves providing agitating mixture of alcohol, ammonia, water, adding metal luminescent particles 100 and metal alkoxide precursor chosen from titanium alkoxide, silicon alkoxide, and aluminum alkoxide to the mixture and forming the coating (A) on luminescent particles 100 and retrieving from the mixture and heat treating the luminescent particles.

The precursor used in sol-gel coating may be silicon alkoxide precursor chosen from formula: R4-Si(-R1)(-R3)(-R2) (I). The silicon alkoxide precursor is preferably chosen from trimethoxy silane, triethoxy silane, tetraethoxy silane, trimethoxy (methyl)silane and triethoxy (methyl)silane. R1-R3=hydrolyzable alkoxy moieties; and R4=1-6C linear alkyl moieties, hydrolyzable alkoxy moieties, and phenyl moiety.

According to implementations, luminescent/optically scattering particles may comprise a luminescent core, a first coating layer ("sol-gel coating layer"), especially having a first coating layer thickness (d1) in the range of 5-500 nm, especially 10-500 nm, yet even more especially 5-500 nm, especially 10-500 nm, yet even more especially 20-500 nm, especially 50-300 nm, such as at least 100 nm, and a second coating layer ("ALD coating layer") especially having a second coating layer thickness (d2) in the range of 5-250 nm, such as especially 5-200 nm, yet even more especially wherein the second coating layer comprises a multilayer with layers having different chemical compositions, and wherein the multilayer comprises one or more layers comprising an oxide of one or more of Al, Hf, Ta, Zr, Ti and Si.

With such luminescent material, i.e. such luminescent material comprising these (hybrid coated) particles, a relative stable luminescent material is provided with quantum efficiencies close to or identical to the virgin (non-coated) luminescent material and having stabilities against water and/or (humid) air which are very high and superior to non-coated or non-hybrid coated luminescent particles.

The first coating layer may optionally include a multi-layer. However, the multi-layers of the first coating layer may be sol-gel layers. Therefore, the first layer is herein also indicated as sol-gel layer (thus optionally including a sol-gel multi-layer). The first coating layer especially comprises silicon oxide (especially $SiO_2$). An example of a multi-layer may include $SiO_2$—$Al_2O_3$ (sol-gel) multi-layer, such as a stack of three or more (sol-gel) layers wherein $SiO_2$ and $Al_2O_3$ alternate.

Likewise, the second coating layer may optionally include a multi-layer. However, the multi-layers of the second coating layer may all be ALD layers. Therefore, the second layer is indicated as ALD layer (thus optionally including an ALD multi-layer).

Especially, the second coating layer does comprise a multi-layer, see also below. Further, especially the second coating layer is provided on the first coating layer, without intermediate layers. Optionally, on the second coating layer, a further coating layer may be provided. The second coating layer especially at least includes one or more aluminum oxide (especially $Al_2O_3$) coating layers. Especially, both the first coating layer and the second coating layer independently comprise metal oxides, though optionally also hydroxides may be included in the one or more of these layers. Further, independently the first coating layer and the second coating layer may include mixed oxide layers. Further, the coating layers need not necessarily to be fully stoichiometric oxides, as is known in the art.

In general, the thickness of the first coating layer will be larger than the thickness of the second coating layer, such as at least 1.2, like at least 1.5, like at least 2 times larger, or even at least 4 times or at least 5 times larger. In a specific embodiment, the method of the invention comprises (i) providing the first coating layer having a first coating layer thickness (d1) in the range of especially 20-500 nm, such as at least 50 nm, even more especially 50-300 nm, such as at least 100 nm, onto the luminescent particles by application of said sol-gel coating process, thereby providing said coated luminescent particles; and (ii) providing the second coating layer having a second coating layer thickness (d2) in the range of especially 5-250 nm, such as 5-200 nm, especially at least 10 nm, even more especially 10-100 nm, such as 15-75 nm, yet more especially 15-50 nm, onto said coated luminescent particles by application of said atomic layer deposition process. Hence, as indicated above, the luminescent particles comprise in an embodiment a luminescent core, a first coating layer having a first coating layer thickness (d1) in the range of especially 5-500 nm, especially 10-500 nm, yet even more especially 20-500 nm, more especially 50-300 nm, such as at least 100 nm, and a second coating layer having a second coating layer thickness (d2) in the range of especially 5-250 nm, even more especially 15-50 nm, such as in the range of 15-35 nm. It appears that thicker first layers provide better results than thinner layers. Hence, especially the first coating layer has a first coating layer thickness of at least 50 nm, such as at least about 100 nm.

The luminescent particles of interest may in principle include each type of luminescent particles. However, especially of interest are those type of luminescent particles that may be less stable in air or water or a humid environment, such as e.g. (oxy)sulfides, (oxy)nitrides, etc. Hence, in an embodiment the luminescent particles comprise one or more of a nitride luminescent material, an oxynitride luminescent material, a halogenide luminescent material, an oxyhalogenide luminescent material, a sulfide luminescent material, and an oxysulfide luminescent material. Additionally or alternatively, the luminescent particles may comprise a selenide luminescent material. Hence, the term "luminescent particles" may also refer to a combination of particles of different types of luminescent materials.

In a specific embodiment, the luminescent particles may be selected from the following group of luminescent material systems: $MLiAl_3N_4$:Eu (M=Sr, Ba, Ca, Mg), $M_2SiO_4$: Eu (M=Ba, Sr, Ca), $MSe_{1-x}S_x$:Eu (M=Sr, Ca, Mg), $MSr_2S_4$: Eu (M=Sr, Ca), $M_2SiF_6$:Mn (M=Na, K, Rb), $MSiAlN_3$:Eu (M=Ca, Sr), $M_8Mg(SiO_4)_4Cl_2$:Eu (M=Ca, Sr), $M_3MgSi_2O_8$: Eu (M=Sr, Ba, Ca), $MSi_2O_2N_2$:Eu (M=Ba, Sr, Ca), $M_2Si_{5-x}Al_xO_xN_{8-x}$:Eu (M=Sr, Ca, Ba). However, other systems may also be of interested to protect by the hybrid coating. Also combinations of particles of two or more different luminescent materials may be applied, such as e.g. a green or a yellow luminescent material in combination with a red luminescent material.

Terms like "M=Sr, Ba, Ca, Mg" indicates, as known in the art, that M includes one or more of Sr, Ba, Ca, and Mg. For instance, referring to $MSiAlN_3$:Eu (M=Ca, Sr), this may refer by way of examples to $CaSiAlN_3$:Eu, or to $SrSiAlN_3$: Eu, or to $Ca_{0.8}Sr_{0.2}SiAlN_3$:Eu, etc. etc. Further, the formula "$MLiAl_3N_4$:Eu (M=Sr, Ba, Ca, Mg)," is equal to the formula $(Sr,Ba,Ca,Mg)LiAl_3N_4$:Eu. Likewise this applies to the other herein indicated formulas of inorganic luminescent materials.

In a further specific embodiment, the luminescent particles may be selected from the following group of luminescent material systems: $M_{1-x-y-z}Z_zA_aB_bC_cD_dE_eN_{4-n}O_n$: $ES_x,RE_y$, with M=selected from the group consisting of Ca (calcium), Sr (strontium), and Ba (barium); Z selected from the group consisting of monovalent Na (sodium), K (potassium), and Rb (rubidium); A=selected from the group consisting of divalent Mg (magnesium), Mn (manganese), Zn (zinc), and Cd (cadmium) (especially, A=selected from the group consisting of divalent Mg (magnesium), Mn (manganese), and Zn (zinc), even more especially selected from the group consisting of divalent Mg (magnesium), Mn (manganese); B=selected from the group consisting of trivalent B (boron), Al (aluminum) and Ga (gallium); C=selected from the group consisting of tetravalent Si (silicon), Ge (germanium), Ti (titanium) and Hf (hafnium); D selected from the group consisting of monovalent Li (lithium), and Cu (copper); E selected for the group consisting of P (the element phosphor), V (vanadium), Nb (niobium), and Ta (tantalum); ES=selected from the group consisting of divalent Eu (europium), Sm (samarium) and ytterbium, especially selected from the group consisting of divalent Eu and Sm; RE=selected from the group consisting of trivalent Ce (cerium), Pr (praseodymium), Nd (neodymium), Sm (samarium), Eu (europium), Gd (gadolinium), Tb (terbium), Dy (dysprosium), Ho (holmium), Er (erbium), and Tm (thulium); with $0 \le x \le 0.2$; $0 \le y \le 0.2$; $0 \le x+y \le 0.4$; $0 \le z \le 1$; $0 \le n \le 0.5$; $0 \le a \le 4$ (such as $2 \le a \le 3$); $0 \le b \le 4$; $0 \le c \le 4$; $0 \le d \le 4$; $0 \le e \le 4$; $a+b+c+d+e=4$; and $2a+3b+4c+d+5e=10-y-n+z$. Especially, $z \le 0.9$, such as $z \le 0.5$. Further, especially $x+y+z \le 0.2$.

The equations $a+b+c+d+e=4$; and $2a+3b+4c+d+5e=10-y-n+z$, respectively, especially determine the Z, A, B, C, D and E cations and O and N anions in the lattice and thereby define (also) the charge neutrality of the system. For instance, the charge compensation is covered by the formula $2a+3b+4c+d+5e=10-y-n+z$. It covers e.g. charge compensation by decreasing O content or charge compensation by substituting a C cation by a B cation or a B cation by an A cation, etc. For example: $x=0.01$, $y=0.02$, $n=0$, $a=3$; then $6+3b+4c=10-0.02$; with $a+b+c=4$: $b=0.02$, $c=0.98$.

As will be clear to a person skilled in the art, a, b, c, d, e, n, x, y, z are always equal to or larger than zero. When a is defined in combination with the equations $a+b+c+d+e=4$; and $2a+3b+4c+d+5e=10-y-n+z$, then in principle, b, c, d, and e do not need to be defined anymore. However, for the sake of completeness, herein also $0 \le b \le 4$; $0 \le c \le 4$; $0 \le d \le 4$; $0 \le e \le 4$ are defined.

Assume a system like $SrMg_2Ga_2N_4$:Eu. Here, $a=2$, $b=2$, $c=d=e$ $y=z=n=0$. In such system, $2+2+0+0+0=4$ and $2*2+3*2+0+0+0=10-0-0+0=10$. Hence, both equations are complied with. Assume that 0.5 O is introduced. A system with 0.5 O can e.g. be obtained when 0.5 Ga—N is replaced by 0.5 Mg—O (which is a charge neutral replacement). This would result in $SrMg_{2.5}Ga_{1.5}N_{3.5}O_{0.5}$:Eu. Here, in such system $2.5+1.5+0+0+0=4$ and $2*2.5+3*1.5+0+0+0=10-0-0.5+0=9.5$. Hence, also here both equations are complied with.

As indicated above, in an advantageous embodiment $d>0$ and/or $z>0$, especially at least $d>0$. Especially, the phosphor comprises at least lithium.

In yet another embodiment, $2 \le a \le 3$, and especially also $d=0$, $e=0$ and $z=0$. In such instances, the phosphor is amongst others characterized by $a+b+c=4$; and $2a+3b+4c=10-y-n$.

In a further specific embodiment, which may be combined with the former embodiments $e=0$. In yet a further specific embodiment, which may be combined with the former embodiments, M is Ca and/or Sr.

Hence, in a specific embodiment, the phosphor has the formula $M(Ca$ and/or $Sr)_{1-x-y}Mg_aAl_bSi_cN_{4-n}O_n$:$ES_x,RE_y$ (I), with ES=selected from the group consisting of divalent Eu (europium) or Sm (samarium) or Yb (ytterbium); RE=selected from the group consisting of trivalent Ce (cerium), Pr (praseodymium), Nd (neodymium), Sm (samarium), Eu (europium), Gd (gadolinium), Tb (terbium), Dy (dysprosium), Ho (holmium), Er (erbium), and Tm (thulium), wherein $y/x<0.1$, especially $<0.01$, and $n \le 0.1$, especially $<0.01$, even more especially $<0.001$, yet even more especially $<0.0001$. Hence, in this embodiment, substantially samarium and or europium containing phosphors are described. For instance, when divalent Eu is present, with $x=0.05$, and for instance y1 for Pr may be 0.001, and y2 for Tb may be 0.001, leading to an $y=y1+y2=0.002$. In such instance, $y/x=0.04$. Even more especially, $y=0$. However, as indicated elsewhere when Eu and Ce are applied, the ratio y/x may be larger than 0.1.

The condition $0<x+y \le 0.4$ indicates that M may be substituted with in total up to 40% of ES and/or RE. The condition "$0<x+y \le 0.4$" in combination with x and y being between 0 and 0.2 indicates that at least one of ES and RE are present. Not necessarily both types are present. As indicated above, both ES and RE may each individually refer to one or more subspecies, such as ES referring to one or more of Sm and Eu, and RE referring to one or more of Ce, Pr, Nd, Sm, Eu, Gd, Tb, Dy, Ho, Er, and Tm.

Especially, when europium is applied as divalent luminescent species or dopant (i.e. $Eu^{2+}$), the molar ratio between samarium and europium (Sm/Eu) is $<0.1$, especially $<0.01$, especially $<0.001$. The same applies when europium in combination with ytterbium would be applied. When europium is applied as divalent luminescent species or dopant, the molar ratio between ytterbium and europium (Yb/Eu) is $<0.1$, especially $<0.01$, especially $<0.001$. Would all three together be applied, then the same molar ratios might apply, i.e. ((Sm+Yb)/Eu) is $<0.1$, especially $<0.01$, especially $<0.001$.

Especially, x is in the range of 0.001-0.2 (i.e. $0.001 \le x \le 0.2$), like 0.002-0.2, such as 0.005-0.1, especially 0.005-0.08. Especially in the case of divalent Europium in the herein described systems, the molar percentage may be in the range of 0.1-5% ($0.001 \le x \le 0.05$), such as 0.2-5%, like 0.5-2%. For other luminescent ions, x may (but is not necessarily) in embodiments be equal to or larger than 1% (x equal to or larger than 0.01).

In a specific embodiment, the phosphor is selected from the group consisting of $(Sr,Ca)Mg_3Si_4$:Eu, $(Sr,Ca)Mg_2Al_2N_4$:Eu, $(Sr,Ca)LiAl_3N_4$:Eu and $(Sr,Ca)Li_dMg_aAl_bN_4$:Eu, with a, b, d as defined above.

As also indicated herein, the notation "(Sr,Ca)", and similar notations with other elements, indicates that the M-positions are occupied with Sr and/or Ca cations (or other elements, respectively).

In a further specific embodiment the phosphor is selected from the group consisting of $Ba_{0.95}Sr_{0.05}Mg_2Ga_2N_4$:Eu, $BaMg_2Ga_2N_4$:Eu, $SrMg_3SiN_4$:Eu, $SrMg_2Al_2N_4$:Eu, $SrMg_2Ga_2N_4$:Eu, $BaMg_3SiN_4$:Eu, $CaLiAl_3N_4$:Eu, $SrLiAl_3N_4$:Eu, $CaLi_{0.5}MgAl_{2.5}N_4$:Eu, and $SrLi_{0.5}MgAl_{2.5}N_4$:Eu. Further (non-limiting) examples for such phosphors are e.g. $(Sr_{0.8}Ca_{0.2})_{0.995}LiAl_{2.91}Mg_{0.09}N_{3.91}O_{0.09}$:$Eu_{0.005}$; $(Sr_{0.9}Ca_{0.1})_{0.905}Na_{0.09}LiAl_3N_{3.91}O_{0.09}$:$Eu_{0.005}$; $(Sr_{0.8}Ca_{0.03}Ba_{0.17})_{0.989}LiAl_{2.99}Mg_{0.01}N_4$:$Ce_{0.01},Eu_{0.001}$; $Ca_{0.995}LiAl_{2.995}Mg_{0.005}N_{3.995}O_{0.005}$:$Yb_{0.005}$ (YB(II)); $Na_{0.995}MgAl_3N_4$:$Eu_{0.005}$; $Na_{0.895}Ca_{0.1}Mg_{0.9}Li_{0.1}Al_3N_4$:$Eu_{0.005}$; $Sr_{0.99}LiMgAlSiN_4$:$Eu_{0.01}$; $Ca_{0.995}LiAl_{2.955}Mg_{0.045}N_{3.96}O_{0.04}$:$Ce_{0.005}$; $(Sr_{0.9}Ca_{0.1})_{0.998}Al_{1.99}Mg_{2.01}N_{3.99}O_{0.01}$:$Eu_{0.002}$; $(Sr_{0.9}Ba_{0.1})_{0.998}Al_{1.99}Mg_{2.01}N_{3.99}O_{0.01}$:$Eu_{0.002}$.

In a further specific embodiment, the phosphor is selected from the group consisting of (Sr,Ca)Mg$_3$SiN$_4$:Eu and (Sr,Ca)Mg$_2$Al$_2$N$_4$:Eu. In yet another specific embodiment, the phosphor is selected from the group consisting of Ba$_{0.95}$Sr$_{0.05}$Mg$_2$Ga$_2$N$_4$:Eu, BaMg$_2$Ga$_2$N$_4$:Eu, SrMg$_3$SiN$_4$:Eu, SrMg$_2$Al$_2$N$_4$:Eu, SrMg$_2$Ga$_2$N$_4$:Eu, and BaMg$_3$SiN$_4$:Eu. Especially, these phosphors, and even more especially (Sr,Ca)Mg$_3$SiN$_4$:Eu and (Sr,Ca)Mg$_2$Al$_2$N$_4$:Eu may be phosphors having good luminescent properties, amongst others in terms of spectral position and distribution of the luminescence.

Of especial interest are phosphors wherein the phosphor complies with $0 \leq x \leq 0.2$, $y/x<0.1$, M comprises at least Sr, $z \leq 0.1$, $a \leq 0.4$, $2.5 \leq b \leq 3.5$, B comprises at least Al, $c \leq 0.4$, $0.5 \leq d \leq 1.5$, D comprises at least Li, $e \leq 0.4$, $n \leq 0.1$, and wherein ES at least comprises Eu. Especially, $y+z \leq 0.1$. Further, especially $x+y+z \leq 0.2$. Further, especially a is close to 0 or zero. Further, especially b is about 3. Further, especially c is close to 0 or zero. Further, especially d is about 1. Further, especially e is close to 0 or zero. Further, especially n is close to 0 or zero. Further, especially y is close to 0 or zero. Especially good systems, in terms of quantum efficiency and hydrolysis stability are those with $z+d>0$, i.e. one or more of Na, K, Rb, Li and Cu(I) are available, especially at least Li, such as e.g. (Sr,Ca)LiAl$_3$N$_4$:Eu and (Sr,Ca)Li$_d$Mg$_a$Al$_b$N$_4$:Eu, with a, b, d as defined above. In a further specific embodiment the phosphor is selected from the group consisting of CaLiAl$_3$N$_4$:Eu, SrLiAl$_3$N$_4$:Eu, CaLi$_{0.5}$MgAl$_{2.5}$N$_4$:Eu, and SrLi$_{0.5}$MgAl$_{2.5}$N$_4$:Eu. Further phosphors of special interest are (Sr,Ca,Ba)(Li,Cu)(Al,B,Ga)$_3$N$_4$:Eu, which comprises as M ion at least Sr, as B ion at least Al, and as D ion at least Li.

Hence, in a specific embodiment, the luminescent particles comprise a luminescent material selected from the SrLiAl$_3$N$_4$:Eu$^{2+}$ class. The term "class" herein especially refers to a group of materials that have the same crystallographic structure(s). Further, the term "class" may also include partial substitutions of cations and/or anions. For instance, in some of the above-mentioned classes Al—O may partially be replaced by Si—N (or the other way around). Examples of the SrLiAl$_3$N$_4$:Eu$^{2+}$ class are provided above. However, other luminescent materials may thus also be possible.

Such luminescent particles may have a number averaged particle size selected from the range of 0.1-50 µm, such as in the range of 0.5-40 µm, such as especially in the range of 0.5-20 µm. Hence, the luminescent core may have dimensions such as at maximum about 500 µm, such as at maximum 100 µm, like at maximum about 50 µm. especially with the larger particles sizes, substantially only individual particles may be coated, leading thus to luminescent core dimensions in the order of 50 µm or smaller. Hence, the invention is direct to the coating of particles. The dimensions of the luminescent core may substantially be smaller when nanoparticles or quantum dots are used as basis for the particulate luminescent material. In such instance, the cores may be smaller than about 1 µm or substantially smaller (see also below for the dimensions of the QDs). Alternatively or additionally, the luminescent particles include luminescent quantum dots. The term "quantum dot" or "luminescent quantum dot" may in embodiments also refer to a combination of different type of quantum dots, i.e. quantum dots that have different spectral properties. The QDs are herein also indicated as "wavelength converter nanoparticles" or "luminescent nanoparticles". The term "quantum dots" especially refer to quantum dots that luminesce in one or more of the UV, visible and IR (upon excitation with suitable radiation, such as UV radiation). The quantum dots or luminescent nanoparticles, which are herein indicated as wavelength converter nanoparticles, may for instance comprise group II-VI compound semiconductor quantum dots selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be group III-V compound semiconductor quantum dots selected from the group consisting of (core-shell quantum dots, with the core selected from the group consisting of) GaN, GaP, GaAs, AN, AlP, AlAs, InN, InP, InGaP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be I-III-VI2 chalcopyrite-type semiconductor quantum dots selected from the group consisting of (core-shell quantum dots, with the core selected from the group consisting of) CuInS$_2$, CuInSe$_2$, CuGaS$_2$, CuGaSe$_2$, AgInS$_2$, AgInSe$_2$, AgGaS$_2$, and AgGaSe$_2$. In yet a further embodiment, the luminescent nanoparticles may for instance be (core-shell quantum dots, with the core selected from the group consisting of) I-V-VI2 semiconductor quantum dots, such as selected from the group consisting of (core-shell quantum dots, with the core selected from the group consisting of) LiAsSe$_2$, NaAsSe$_2$ and KAsSe$_2$. In yet a further embodiment, the luminescent nanoparticles may for instance be core-shell quantum dots, with the core selected from the group consisting of) group (IV-VI compound semiconductor nano crystals such as SbTe. In a specific embodiment, the luminescent nanoparticles are selected from the group consisting of (core-shell quantum dots, with the core selected from the group consisting of) InP, CuInS$_2$, CuInSe$_2$, CdTe, CdSe, CdSeTe, AgInS$_2$ and AgInSe$_2$. In yet a further embodiment, the luminescent nanoparticles may for instance be one of the group (of core-shell quantum dots, with the core selected from the group consisting of) II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl. Herein, the luminescent nanoparticles based luminescent material may also comprise different types of QDs, such as CdSe and ZnSe:Mn.

It appears to be especially advantageous to use II-VI quantum dots. Hence, in an embodiment the semiconductor based luminescent quantum dots comprise II-VI quantum dots, especially selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, even more especially selected from the group consisting of CdS, CdSe, CdSe/CdS and CdSe/CdS/ZnS.

In an embodiments, the wavelength converter nanoparticles have an average particle size in a range from about 1 to about 1000 nanometers (nm), and preferably in a range from about 1 to about 100 nm. In an embodiment, nanoparticles have an average particle size in a range from about 1 to about 20 nm. In an embodiment, nanoparticles have an average particle size in a range from about 1 to about 10 nm. The luminescent nanoparticles (without coating) may have dimensions in the range of about 2-50 nm, such as 2-20 nm, especially 2-10 nm, even more especially 2-5 nm; especially at least 90% of the nanoparticles have dimension in the indicated ranges, respectively, (i.e., e.g. at least 90% of the nanoparticles have dimensions in the range of 2-50 nm, or especially at least 90% of the nanoparticles have dimensions in the range of 2-5 nm). The term "dimensions" especially relate to one or more of length, width, and diameter, dependent upon the shape of the nanoparticle. Typical dots are made of binary alloys such as cadmium selenide, cadmium sulfide, indium arsenide, and indium phosphide. However, dots may also be made from ternary alloys such as cadmium selenide sulfide. These quantum dots can contain as few as 100 to 100,000 atoms within the quantum dot volume, with a diameter of 10 to 50 atoms. This corresponds to about 2 to 10 nanometers. For instance, spherical particles such as CdSe, InP, or CuInSe$_2$, with a diameter of about 3 nm may be provided. The luminescent nanoparticles (without coating) may have the shape of spherical, cube, rods, wires, disk, multi-pods, etc., with the size in one dimension of less than 10 nm. For instance, nanorods of CdSe with the length of 20 nm and a diameter of 4 nm may be provided. Hence, in an embodiment the semiconductor based luminescent quantum dots comprise core-shell quantum dots. In yet another embodiment, the semiconductor based luminescent quantum dots comprise dots-in-rods nanoparticles. A combination of different types of particles may also be applied. Here, the term "different types" may relate to different geometries as well as to different types of semiconductor luminescent material. Hence, a combination of two or more of (the above indicated) quantum dots or luminescent nano-particles may also be applied.

In an embodiment, nanoparticles can comprise semiconductor nanocrystals including a core comprising a first semiconductor material and a shell comprising a second semiconductor material, wherein the shell is disposed over at least a portion of a surface of the core. A semiconductor nanocrystal including a core and shell is also referred to as a "core/shell" semiconductor nanocrystal. Any of the materials indicated above may especially be used as core. Therefore, the phrase "core-shell quantum dots, with the core selected from the group consisting of is applied in some of the above lists of quantum dot materials. The term "core-shell" may also refer to "core-shell-shell", etc., including gradient alloy shell, or dots in rods, etc.

For example, the semiconductor nanocrystal can include a core having the formula MX, where M can be cadmium, zinc, magnesium, mercury, aluminum, gallium, indium, thallium, or mixtures thereof, and X can be oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness from about one to about ten monolayers. An overcoating can also have a thickness greater than ten monolayers. In an embodiment, more than one overcoating can be included on a core.

In an embodiment, the surrounding "shell" material can have a band gap greater than the band gap of the core material. In certain other embodiments, the surrounding shell material can have a band gap less than the band gap of the core material. In an embodiment, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell (see further also above for examples of specific wavelength converter nanoparticles, based on semiconductors).

Therefore, in an embodiment the luminescent particles comprises a luminescent material selected from the group consisting of luminescent quantum dots comprising one or more core materials selected from the group consisting of CdS, CdSe, ZnS, and ZnSe. Hence, in an embodiment the luminescent particles may also be selected from the group of luminescent nanoparticles such as quantum dots or quantum rods of composition MX (M=Cd, Zn, X=Se, S). Such particles may have a number averaged particle size (i.e., especially length/width/height, diameter), selected from the range of 1-50 nm.

As indicated above, the first coating layer that typically has an average thickness in the 5-500 nm, especially 10-500 nm, yet even more especially 20-500 nm, even more especially 50-300 nm range, is formed by a sol-gel type process. In such process, an inorganic network is formed from a homogeneous solution of precursors by subsequent hydrolysis to form a sol (colloidal suspension) and condensation to then form a gel (cross-linked solid network) that is chemically bonded to the powder surfaces. Preferably, the first coating material is silica and the sol-gel deposition method corresponds to the so-called Stöber reaction as described in Stöber, W., A. Fink, et al. "Controlled growth of monodisperse silica spheres in the micron size range."

Journal of Colloid and Interface Science 26(1): 62-69. To this end the luminescent material is dispersed in an alcohol such as an aliphatic alcohol R—OH such as methanol $CH_3OH$, ethanol $C_2H_5OH$ or iso-propanol $C_3H_7OH$ followed by addition of ammonia ($NH_3$ solution in water) and a silicon alkoxide precursor. The silicon alkoxide precursor dissolves in the alcohol+ammonia mixture and starts to hydrolyze. A conformal silica coating is formed on top of the particle surfaces by reaction of the hydrolyzed, yet dissolved sol species with reactive groups of the particle surfaces (e.g. amine or silanol groups) followed by a seeded growth process that consists of hydrolysis, nucleation and condensation reactions steps.

The silicon alkoxide precursor is selected from a group of compounds that is formed by

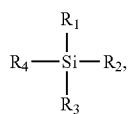

wherein a) R1, R2, R3 are hydrolysable alkoxy groups and R4 is selected from the group of C1-C6 linear alkyl groups, hydrolysable alkoxy groups and a phenyl group, orb) R1, R2, R3 are individually selected from —$OCH_3$ and —$OC_2H_5$ and R4 is selected from —$CH_3$, —$C_2H_5$, —$OCH_3$, —$OC_2H_5$ and a phenyl group. Optionally, the silicone based polymer is obtained from a material from the group of:

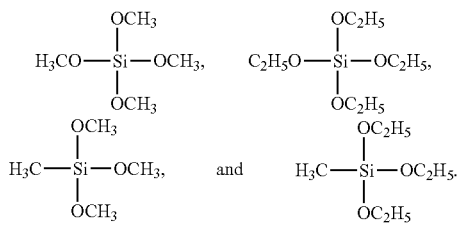

Hence, the silicon alkoxide precursor is selected from a group may be selected from this group. Especially, the silicon alkoxide precursor is selected from the group of $Si(OCH_3)_4$ or $Si(OC_2H_5)_4$, more especially $Si(OC_2H_5)_4$ is used as silicone alkoxide precursor. Similar precursors, but based on another metal such as e.g. Al may also be used.

A typical first coating process may comprise the following stages: (a) the luminescent powder is suspended in an alcohol—aqueous ammonia solution mixture while stirring or sonication. To improve particle dispersion, the powder can also first be mixed with alcohol and a small amount of a silicon (or other metal) alkoxide before the ammonia solution is added. (b) A silicon (or other metal) alkoxide precursor is added under agitation of the suspension. Typical concentrations of silicone (or other metal) alkoxide, ammonia and water in the alcohol solvent are 0.02-0.7, 0.3-1.5, and 1-16 mole/l, respectively. (c) The suspension is stirred or sonicated until the coating has formed. (d) The coated powder is washed with alcohol and dried followed by calcination in air or vacuum at 200-300° C.

Hence, in an embodiment the sol-gel coating process comprises: (ia) providing a mixture of an alcohol, ammonia, water, the luminescent particles and a metal alkoxide precursor while agitating the mixture, and allowing the first coating to be formed on the luminescent particles, wherein the metal alkoxide precursor is especially selected from the group consisting of an titanium alkoxide, a silicon alkoxide, and an aluminum alkoxide; and (ib) retrieving the luminescent particles from the mixture and optionally subjecting the luminescent particles to a heat treatment to provide said coated luminescent particles. The process of retrieving the (coated) luminescent materials from the mixture may e.g. include one or more of filtration, centrifuging, decanting (the liquid over a precipitate), etc. The heat treatment may include one or more of drying and calcination, especially both, i.e. e.g. a drying stage at a temperature in the range of 70-130° C. followed by a calcination stage (in air; or vacuum or an (other) inert atmosphere). Hence, during part of the time of the heat treatment, the (coated) luminescent may be in an inert environment, such as vacuum, or one or more of $N_2$ and a noble gas, etc. The heat treatment seems to improve the stability of the luminescent material. Further, as indicated above in the sol-gel coating process a silicon (or other metal; though the formula below refers to Si) alkoxide especially a precursor may be used selected from the group of compounds consisting of:

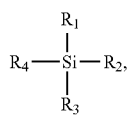

wherein R1, R2, R3 are selected from the group consisting of hydrolysable alkoxy moieties and R4 is selected from the group consisting of C1-C6 linear alkyl moieties, hydrolysable alkoxy moieties, and a phenyl moiety. Optionally other ligands than alkoxides may be applied in precursor for the sol-gel process.

The particles obtained with sol-gel coating process may optionally include more than one nucleus. For instance in the case of quantum dots, agglomerates with a sol-gel coating or first coating layer may be obtained. Hence, the silica precursor (or other metal oxide precursor) can also coat multiple QDs with thin single shells to form a coated agglomerate. This may amongst others depend upon the concentration of the quantum dots, etc.

Above, the precursors for the sol-gel coating are especially described in relation to a silicon alkoxide precursor. However, also aluminum (or another metal) alkoxide precursor(s) may be applied. Further, also a combination of two or more chemically different precursors may be applied for providing the sol-gel coating layer or first coating layer.

The term "first coating process" may also relate to a plurality of first coating processes. With a plurality of first coating processes one may provide a (multi-)layer substantially comprising the same composition through the entire layer thickness (when e.g. in the first coating process each coating stage or step includes depositing substantially the same material), or may provide a multi-layer with two or more layers having different compositions, such as a stack of two or more (sol-gel) layers with two or more different compositions, respectively. An example may e.g. be a $SiO_2$—$Al_2O_3$ (sol-gel) multi-layer, such as a stack of three or more (sol-gel) layers wherein $SiO_2$ and $Al_2O_3$ alternate (see also above).

As indicated above, the second coating layer may typically have a layer thickness in the 5-250 nm, especially 15-75 nm range. The layer may be formed by an atomic layer deposition type process. In such process a polymeric network is formed by reaction of a metal oxide precursor with an oxygen source such as water and/or ozone in the gas phase. Unlike in the sol-gel process the ALD reaction is split in (at least) two parts. In a first step the metal (oxide) precursor is fed into a(n ALD) reactor and adsorbs and/or reacts with reactive groups on the particle surfaces and substantially all non-reacted or adsorbed precursor molecules are removed by reactor purging. In a second step the oxygen source is fed into the reactor and reacts with the metal source on the particle surfaces followed by purging of the reactor to remove substantially all remaining oxygen source molecules and hydrolysis products formed by condensation reactions. The two steps lead to formation of an atomic layer (or monolayer) because of the self-limiting nature of the surface reaction. These atomic layer reaction steps are repeated multiple times to form the final ALD coating. The term metal oxide precursor especially indicates a precursor of the metal oxide. The precursor itself may not be a metal oxide, but may e.g. include metal organic molecule. Hence, especially the metal (oxide) precursors for ALD may typically include metal halides, alkoxides, amides, and other metal (organic) compounds.

The step by step nature of the ALD process allows to easily deposit defined layer thicknesses. The ALD process further allows it to deposit layers of different composition by consecutively feeding different metal oxide precursor into the reactor to form multicomponent layers or nanolaminates. Hence, in a specific embodiment the second layer comprises a multilayer (see also below).

For the ALD process, amongst others a fluidized bed reactor may be applied. Hence, in a specific embodiment the second coating layer is provided by application of said atomic layer deposition process. In an embodiment, a static powder bed is used for ALD coating of the sol-gel coated luminescent powder particles. However, also a fluidized bed may be applied. Other type of reactors may also be applied. Particle agglomeration may substantially be prevented by applying a first sol-gel coating with a structured, nanoporous surface. The process can easily scaled up and nearly no powder loss during ALD coating is observed. Commercially available ALD reactors for powder coating are e.g. sold by Picosun Oy with e.g. a cartridge sample holder (POCA™). A system that may be used for ALD is e.g. described in WO 2013171360 A1, though other systems may also be applied.

A (non-limited) number of suitable materials for the ALD second coating layer are listed in the following table:

| Oxide material | Metal (oxide_precursor) | Oxygen source | Deposition T [° C.] |
| --- | --- | --- | --- |
| $Al_2O_3$ | $Al(CH_3)_3$ (TMA) or $HAl(CH_3)_2$ | $H_2O$ or $O_3$ | 100-400 |
| $HfO_2$ | $Hf(N(CH_3)_2)_4$ or $Hf(N(CH_2CH_3)_2)_4$ | $H_2O$ | 80-300 |
| $Ta_2O_5$ | $TaCl_5$ or $Ta(N(CH_3)_2)_5$ | $H_2O$ | 80-300 |
| $ZrO_2$ | $ZrCl_4$ or $Zr(N(CH_3)_2)_4$ | $H_2O$ | 80-300 |
| $TiO_2$ | $TiCl_4$, $Ti(OCH_3)_4$ or $Ti(OEt)_4$ | $H_2O$ | 80-300 |
| $SiO_2$ | $SiCl_4$, $H_2N(CH_2)_3Si(OEt)_3$ or $Si(OEt)_4$ | $H_2O$ or $O_3$ | 150-300 |

Alternatively or additionally, niobium oxide (especially $Nb_2O_5$) or yttrium oxide ($Y_2O_3$) may be applied. Metal precursors thereof are e.g., tert-butylimido)-tris (diethylamino)-niobium, $NbF_5$, or $NbCl_5$, and Tris(ethylcyclopentadienyl) Yttrium, respectively.

However, other materials may also be applied. Hence, in the atomic layer deposition process a metal oxide precursor may especially be selected from the group of metal oxide precursors of metals selected from the group consisting of Al, Hf, Ta, Zr, Ti and Si. Alternatively or additionally, one or more of Ga, Ge, V and Nb may be applied. Even more especially, alternating layers of two or more of these precursors are applied, wherein at least one precursor is selected from the group consisting of an Al metal oxide precursor and an Si metal oxide precursor, especially an Al metal oxide metal oxide precursor, and another precursor is selected from the group consisting of a Hf metal oxide precursor, a Ta metal oxide precursor, a Zr metal oxide precursor and a Ti metal oxide precursor, especially selected from the group consisting of a Hf metal oxide precursor, a Ta metal oxide precursor, and a Zr metal oxide precursor, even more especially a Ta metal oxide precursor. Especially Hf, Zr, and Ta appear to provide relatively light transmissive layers, whereas Ti, for instance, may provide relatively less light transmissive layers. Processing with Ta, Hf and Zr seems to be relatively easier than Si, for instance. The terms "oxide precursor" or "metal oxide precursor" or "metal (oxide) precursor" may also refer to a combination of two or more chemically different precursors. These precursors especially form an oxide upon reaction with the oxygen source (and are therefore indicated as metal oxide precursor).

For instance, silanol groups (assuming a silica first coating layer) at the nanoporous surface of the sol-gel first coating layer act as reactive sites during ALD of the initial layers. In an embodiment, alumina is deposited by using $Al(CH_3)_3$ (TMA) as metal oxide precursor and (subsequently exposure to) water as the oxygen source. In the first reaction step, TMA reacts with surface silanol groups of the silica sol gel layer according to:

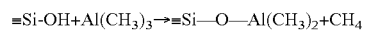

Water then reacts in the second reaction step with the metal oxide precursor by hydrolysis followed by condensation reactions:

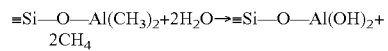

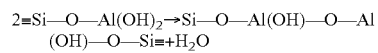

It turned out that deposition temperatures in the 200-350° C. range are most suitable for alumina ALD on the first coating layer, preferably the temperature is in the 250-300° C. range. Similar temperatures may be applied for ALD of other metal oxide precursors for the ALD layer(s).

Especially, the ALD alumina (or other metal oxide) layer has a thickness of 5-120 nm, more especially a thickness of 10-75 nm, yet even more especially a thickness in the 15-50 nm range.

Water gas penetration barrier properties of alumina ALD layers can be further improved by depositing at least one additional layer of a different oxide material such as $ZrO_2$, $TiO_2$, $Y_2O_3$, $Nb_2O_5$, $HfO_2$, $Ta_2O_5$. Especially, the thickness of the additional material layer is in the range 1-40 nm, more preferably in the range 1-10 nm. Even more preferred are nanolaminate stacks of alternating layers of $Al_2O_3$ and a second oxide material from the group of $ZrO_2$, $TiO_2$, $Y_2O_3$, $Nb_2O_5$, $HfO_2$, $Ta_2O_5$. A suitable nanolaminate stack may be e.g. 20×(1 nm $Al_2O_3$ (10 ALD cycles)+1 nm $ZrO_2$ (11 ALD cycles)) deposited at 250° C. to form a 40 nm thick nanolaminated $2^{nd}$ coating on top of the first sol-gel coating.

The invention especially provides in an embodiment a method wherein the second coating layer comprises a multilayer with layers having different chemical compositions, and wherein in the atomic layer deposition process a metal oxide precursor is—amongst others-selected from the group of metal oxide precursors of metals selected from the group consisting of Al, Hf, Ta, Zr, Ti, Si, Ga, Ge, V and Nb, especially the metal oxide precursor is selected from the group of metal oxide precursors of metals selected from the group consisting of Al, Hf, Ta, Zr, Ti and Si. Also combinations of two or more of such precursors may be used, e.g. a multilayer comprising alumina—a mixoxide of zirconium and hafnium—alumina, etc.

Hence, in an embodiment the second coating layer may comprise a multilayer with layers having different chemical compositions, and wherein the multilayer comprises one or more layers comprising an oxide of one or more of Al, Hf, Ta, Zr, Ti, Si, Ga, Ge, V, and Nb, especially wherein the multilayer comprises one or more layers comprising an oxide of one or more of Al, Hf, Ta, Zr, Ti and Si. One or more layers of such multi-layers may also include mixoxides, such as indicated above.

Especially the method is applied such that a(n ALD) multi-layer coating is obtained including at least two (ALD) layers ("AB"), even more especially at least three layers (e.g. "ABA"), yet even more at least four layers. Yet more especially, at least a stack comprising two or more stack of subsets of two (ALD) layers ("AB") is applied, such as (AB)n, wherein n is 2 or more, such as 2-20, like 2-10.

Especially, at least one of the layers of the multi-layer comprises one or more of an oxide of Al and Si (including a combination thereof), and at least one of the layers of the multi-layer comprises one or more of an oxide of Hf, Ta, Zr, Ti, Ga, Ge, V, and Nb. Such layer may optionally also include Al, Hf, Ta, Zr, Ti, Si, Ga, Ge, V, and Nb, wherein Si or Al are in a layer together with one or more of the other indicated elements, when the other layer(s) of the multi-layer comprise an oxide of silica or alumina, respectively. The term "ALD multi-layer" or "multi-layer" as indicated above especially refers to layers having different chemical compositions. The phrase "layers having different chemical compositions" indicates that there are at least two layers having different chemical compositions, such as in the case of "ABC", or in the case of (AB)n.

Specific examples of (AB)n include multi-layers wherein A is selected from one or more of an oxide of Si and Al, especially Al, and wherein B is selected from one or more of an oxide of Al, Hf, Ta, Zr, Ti, Si, Ga, Ge, V, and Nb, wherein Si or Al are in a layer together with one or more of the other indicated elements, when the other layer(s) of the multi-layer comprise an oxide of silica or alumina, respectively, especially wherein B is selected from one or more of an oxide of Hf, Ta, Zr, Ti, Ga, Ge, V, and Nb, yet even more especially wherein B is selected from one or more of an oxide of Hf, Ta, Zr, and Ti, more especially wherein B is selected from one or more of an oxide of Hf, Ta, and Zr.

This ALD multi-layer is thus especially provided on the sol-gel layer. Further, as indicated above, on top of the ALD multi-layer, optionally one or more further layers may be applied.

Hence, in a specific embodiment the second coating layer comprises a multi-layer with a stack of layers, with adjacent layers having different chemical compositions.

Especially, the layers of the multi layer have each independently thicknesses in the range of 1-40 nm, especially 1-10 nm. Further, especially, the multi-layer comprises one or more alumina layers and one or more metal oxide layers, with the metal selected from the group of Hf, Ta, Zr and Ti.

Therefore, in a specific embodiment in the atomic layer deposition process a metal oxide precursor selected from the group consisting of $Al(CH_3)_3$, $HAl(CH_3)_2$, $Hf(N(CH_3)_2)_4$, $Hf(N(CH_2CH_3)_2)_4$, $Hf[N(CH_3)(CH_2CH_3)]_4$, $TaCl_5$, $Ta(N(CH_3)_2)_5$, $Ta\{[N(CH_3)(CH_2CH_3)]_3N(C(CH_3)_3)\}$, $ZrCl_4$, $Zr(N(CH_3)_2)_4$, $TiCl_4$, $Ti(OCH_3)_4$, $Ti(OCH_2CH_3)_4$, $SiCl_4$, $H_2N(CH_2)_3Si(OCH_2CH_3)_3$, and $Si(OCH_2CH_3)_4$, and an oxygen source selected from the group consisting of $H_2O$ and $O_3$ are applied. As indicated above, also two or more different metal oxide precursors and/or two or more different oxygen sources may be applied.

Further, in yet an embodiment of the method in the atomic layer deposition process a multi-layer is provided, with layers having different chemical compositions, wherein one or more layers comprise tantalum oxide (especially $Ta_2O_5$). Hence, the invention also provides in an embodiment luminescent material, wherein the second coating layer comprises a multilayer with layers having different chemical compositions, wherein one or more layers may especially comprise $Ta_2O_5$. Further, in an embodiment of the method in the atomic layer deposition process a multi-layer is provided, with layers having different chemical compositions, wherein one or more layers comprise one or more of tantalum oxide (especially $Ta_2O_5$), hafnium oxide and zirconium oxide. Hence, the invention also provides in an embodiment luminescent material, wherein the second coating layer comprises a multilayer with layers having different chemical compositions, wherein one or more layers may especially comprise one or more of tantalum oxide, hafnium oxide and zirconium oxide. For instance, the multilayer stack may also include an stack with alternating layers wherein e.g. alumina alternates with one or more of tantalum oxide (especially $Ta_2O_5$), hafnium oxide and zirconium oxide, such as a stack comprising e.g. alumina-tantalum oxide-alumina-Hafnia-alumina-tantalum oxide etc.

Further, it appeared that when first an ALD coating was provided on the luminescent material particles (thus when e.g., preceding a subsequent the sol-gel layer) the ALD layer was less uniform than desirable. Hence, to obtain a good ALD layer, the ALD layer thickness may have to be increased more than in principle would be necessary, which may lead to an unnecessary reduction in transmission (even though in some cases small). Further, it appeared that an ALD coating coats more easily to a sol-gel obtained coating, whereas a sol-gel coating may less easily coat to an ALD coating. Further, a sol-gel process on an ALD layer might be harmful for the ALD layer.

The use of a final layer, i.e. a layer further away of the luminescent core comprising a metal oxide layer, with the metal selected from the group of Hf, Ta, Zr and Ti, seems especially beneficial in terms of stability. Further, using thin individual layers, such as thinner than about 10 nm, such as at least 5 nm, like at least 1 nm, also seems to add to the stability of the luminescent material.

Hence, the total layer thickness of the second coating layer is especially in the range of 5-250 nm, such as 10-200 nm, especially like 15-120 nm, such as 15-50 nm, like 20-75 nm.

When a non-oxide luminescent material is applied, during and/or before the method of the invention, i.e. especially the first coating process, an oxygen containing layer may be formed on the particles of the luminescent materials, leading to an intermediate oxygen containing layer between the core and the first coating layer. Hence, in a further embodiment the luminescent core comprises a non-oxide, and there is an intermediate oxide layer between the luminescent core and the first coating layer. The thickness of this intermediate layer may be in the range of 0.5-50 nm, such as 1-20 nm.

The layer thicknesses described herein are especially average layer thicknesses. However, especially at least 50%, even more especially at least 80%, of the area of the respective layers have such indicated layer thickness. Especially this indicates that under at least 50% of the area of such layer, such thickness will be found.

The first coating layer and the second coating layer are light transmitting which means that at least a portion of the light, which impinges on the respective layers, is transmitted through the respective layer. Thus, the first layer and the second layer may be fully or partially transparent, or may be translucent. More than 90% of the (visible) light which impinges on the coating layers may be transmitted through the coating layers. The first coating layer and/or the second coating layer may be light transmitting because of characteristics of the materials of which the coating layers are made. For example, the coating layer may be made from a material which is transparent, even if the layer is relatively thick. The first coating layer and/or the second coating layer is thin enough such that the respective layer becomes light transmitting while the material of which the layer is manufactured is not transparent or translucent when manufactured in relatively thick layers. The materials described herein are all transmissive for (visible) light or can be made in suitable layer thicknesses that are transmissive for (visible) light.

A lighting device comprising a light source configured to generate light source radiation, especially one or more of blue and UV, and a wavelength converter comprising the luminescent material as described herein, wherein the wavelength converter is configured to convert at least part of the light source radiation into wavelength converter light (such as one or more of green, yellow, orange and red light). The wavelength converter is especially radiationally coupled to the light source. The term "radiationally coupled" especially means that the light source and the luminescent material are associated with each other so that at least part of the radiation emitted by the light source is received by the luminescent material (and at least partly converted into luminescence). Hence, the luminescent cores of the particles can be excited by the light source radiation providing luminescence of the luminescent material in the core. In an embodiment, the wavelength converter comprises a matrix (material) comprising the luminescent material (particles). For instance, the matrix (material) may comprise one or more materials selected from the group consisting of a transmissive organic material support, such as selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), silicone, polyvinylchloride (PVC), polyethylene terephthalate (PET), (PETG) (glycol modified polyethylene terephthalate), PDMS (polydimethylsiloxane), and COC (cyclo olefin copolymer). Alternatively or additionally, the matrix (material) may comprise an epoxy resin.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

Especially, the light source is a light source that during operation emits (light source radiation) at least light at a wavelength selected from the range of 200-490 nm, especially a light source that during operation emits at least light at wavelength selected from the range of 400-490 nm, even more especially in the range of 440-490 nm. This light may partially be used by the wavelength converter nanoparticles (see further also below). Hence, in a specific embodiment, the light source is configured to generate blue light. In a specific embodiment, the light source comprises a solid state LED light source (such as a LED or laser diode). The term "light source" may also relate to a plurality of light sources, such as 2-20 (solid state) LED light sources. Hence, the term LED may also refer to a plurality of LEDs. The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL. In an embodiment, the light source may also provide light source radiation having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source radiation with a correlated color temperature in the range of 5000-20000 K, even more especially in the range of 6000-20000 K, such as 8000-20000 K. An advantage of the relative high color temperature may be that there may be a relative high blue component in the light source radiation.

FIG. 4 schematically depicts a lighting device 20 comprising a light source 10 configured to generate light source radiation 11, especially one or more of blue and UV, as well as a wavelength converter 30 comprising the luminescent material 1 with particles as defined herein. The wavelength converter 30 may e.g. comprise a matrix, such as a silicone or organic polymer matrix, with the coated particles embedded therein. The wavelength converter 30 is configured to (wavelength) convert at least part of the light source radiation 11 into wavelength converter light 21, which at least comprises wavelength converter light 31 and optionally also light source radiation 11. The wavelength converter light 31 at least includes luminescence from the herein described coated particles. However, the wavelength converter 30 may optionally include also one or more other luminescent materials. The wavelength converter 30, or more especially the luminescent material 1, may be arranged at a non-zero distance d3, such as at a distance of 0.1-100 mm. However, optionally the distance may be zero, such as e.g. when the luminescent material is embedded in a dome on a LED die. The distance d3 is the shortest distance between a light emitting surface of the light source, such as a LED die, and the wavelength converter 30, more especially the luminescent material 1.

FIG. 5a schematically depicts luminescent powder particles having a sol-gel first coating forming a static powder bed during ALD of a second coating. The particles are indicated with references 100 and the sol-gel coating or first coating layer is indicated with reference 110. The luminescent cores are indicated with reference 102, and may include e.g. micrometer dimensional particles of a luminescent nitride or sulfide phosphor, but may also include other (smaller) material such as luminescent nanoparticles (see further FIG. 5c). As schematically shown in FIG. 5a, the outer shape of the first coating layer 110 may have a somewhat pocked shape, as was found in SEM. By way of example, the smaller particles in FIG. 5a indicate e.g. ALD precursor (see further below). Reference 100a is used to indicate the luminescent particles 100 only having the sol-gel first coating layer 110.

Figure 5D:
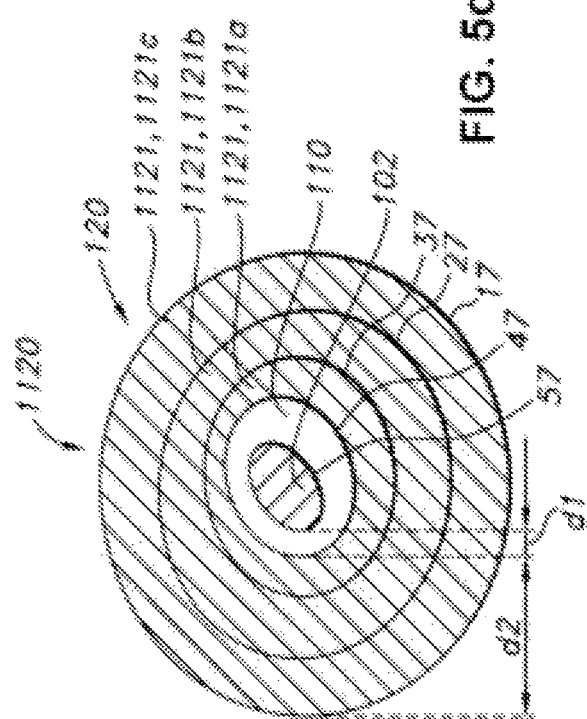
FIG. 5d schematically depicts an aspect of a particulate luminescent material.

FIGS. 5b-5d schematically depict some further aspects of the particulate luminescent material; FIG. 5b shows a luminescent material 1, here by way of example two particles with luminescent cores 102, and a first coating layer 110 (formed by sol-gel coating), having a thickness d1, and a second coating layer 120 (formed by ALD), having a thickness d2. The thicknesses are not necessarily on scale. The possible indentations in the first coating layer 110 are not depicted. The thickness d1 may especially be a mean thickness, averaged over the first coating layer 110; likewise this may apply to the second thickness d2, etc. (see also below).

FIG. 5c schematically depicts a luminescent core 102 which includes a luminescent nanoparticle, here by way of example a quantum dot 130. The quantum dot in this example comprises a quantum rod with a (semiconductor) core material 106, such as ZnSe, and a shell 107, such as ZnS. Of course, other luminescent nanoparticles may also be used. Such luminescent quantum dot 130 can also be provided with the hybrid coating.

As indicated above, the coating layer may include multi-layers; especially the second coating layer 120 may include a multi-layer coating. This is schematically shown in FIG. 5d, wherein the second coating layer 120 comprises an ALD multi-layer 1120, with layers 1121. References 1121a, 1121b and 1121c schematically indicate the individual layers, which may e.g. alternating $Al_2O_3$ layers (by way of example 1121b) and $Ta_2O_5$ layers (by way of example 1121a, 1121c), respectively. Reference d2 indicates the thickness of the entire second coating layer 120. The individual ALD layers may e.g. have thicknesses in the range of 0.5-20 nm.

FIG. 5d indicates with references 17, 27, 37, 47 and 57 the surfaces of the respective layers. As indicated above, the layer thicknesses described herein are especially average layer thicknesses. Especially at least 50%, even more especially at least 80%, of the area of the respective layers have such indicated layer thickness. Hence, referring to the thickness d2 between surface 17 and surface 47, below at least 50%> of surface 17, a layer thickness in the range of e.g. 5-250 nm may be found, with the other less than at least 50% of the surface area 17 e.g. smaller or larger thicknesses may be found, but in average d2 of the second coating (multi-) layer 120 is in the indicated range of 5-250. Likewise, this may apply to the other herein indicated thicknesses. For instance, referring to the thickness d1 between surface 47 and surface 57, this thickness may over at least 50% of the area of 47 be in the range of 20-500 nm, with the other less than at least 50% of the surface area 47 e.g. smaller or larger thicknesses may be found, but in average d1 of the first layer 110 is in the indicated range of 5-500 nm, such as especially 20-500.

FIGS. 5a-5d schematically depict luminescent particles 100 having a single nucleus. However, optionally also aggregates encapsulated with the first and the second coating layer may be formed. This may especially apply for quantum dots as luminescent cores.

Figure 6A:
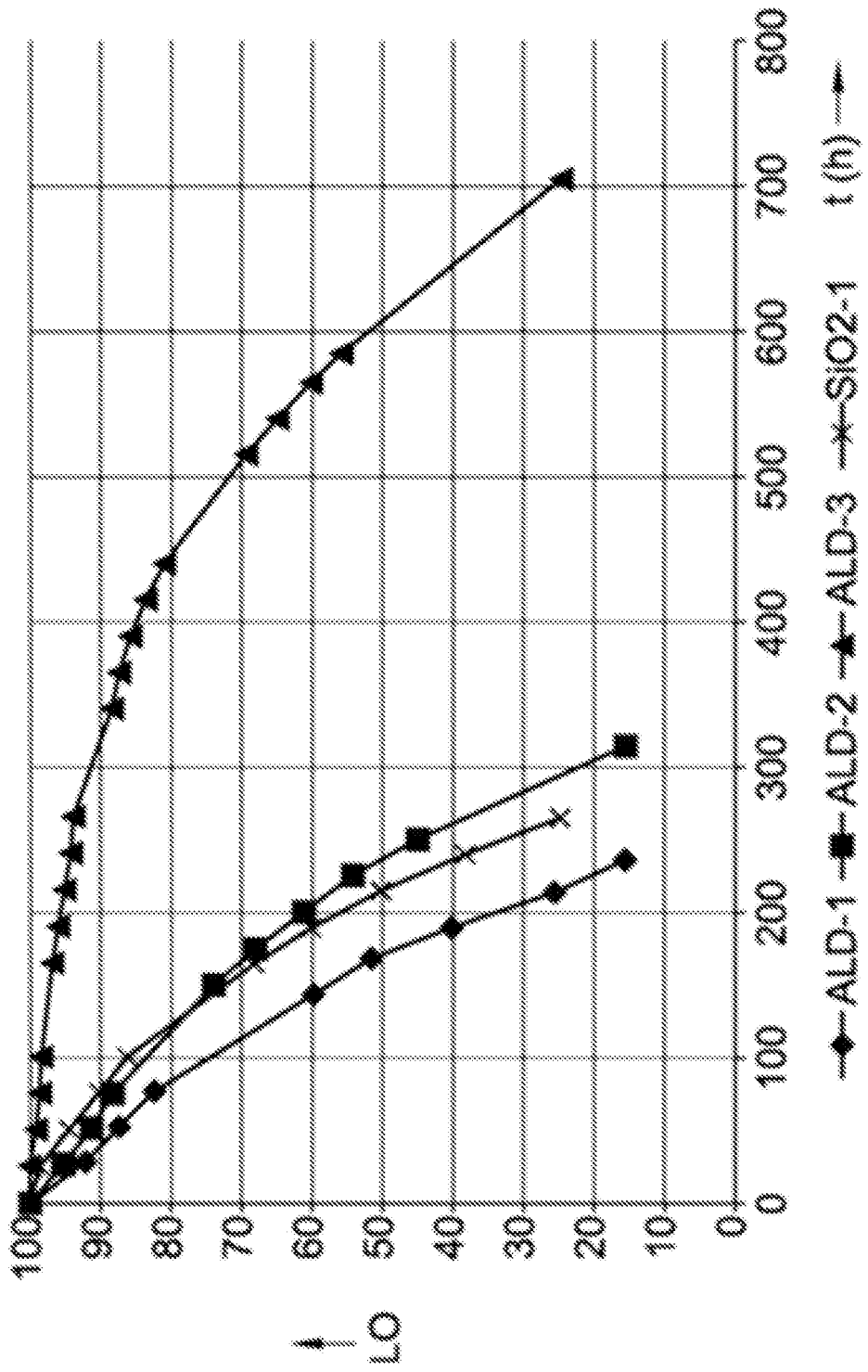
FIG. 6a shows the relative light output (LO) as a function of degradation time (in hours) for phosphor powder before ($SiO_2$ only) and after ALD coating ($Al_2O_3$ on $SiO_2$); degradation conditions: 60° C./100% relative humidity: ALD-1: 20 nm $Al_2O_3$ on phosphor; ALD-2: 40 nm $Al_2O_3$ on phosphor; ALD-3: 20 nm $Al_2O_3$ deposited on $SiO_2$ coating; $SiO_2$-1: sol-gel $SiO_2$ coating on phosphor (basis of ALD-3)

FIG. 6a shows the relative light output as a function of degradation time (in hours) for phosphor powder before ($SiO_2$ only) and after ALD coating ($Al_2O_3$ on $SiO_2$); degradation conditions: 60° C./100% relative humidity: ALD-1: 20 nm $Al_2O_3$ on phosphor; ALD-2: 40 nm $Al_2O_3$ on phosphor; ALD-3: 20 nm $Al_2O_3$ deposited on $SiO_2$ coating; $SiO_2$-1: sol-gel $SiO_2$ coating on phosphor (basis of ALD-3). It is clear that only sol-gel coated material or only ALD coated material is inferior to the hybrid coating.

Figure 6B:
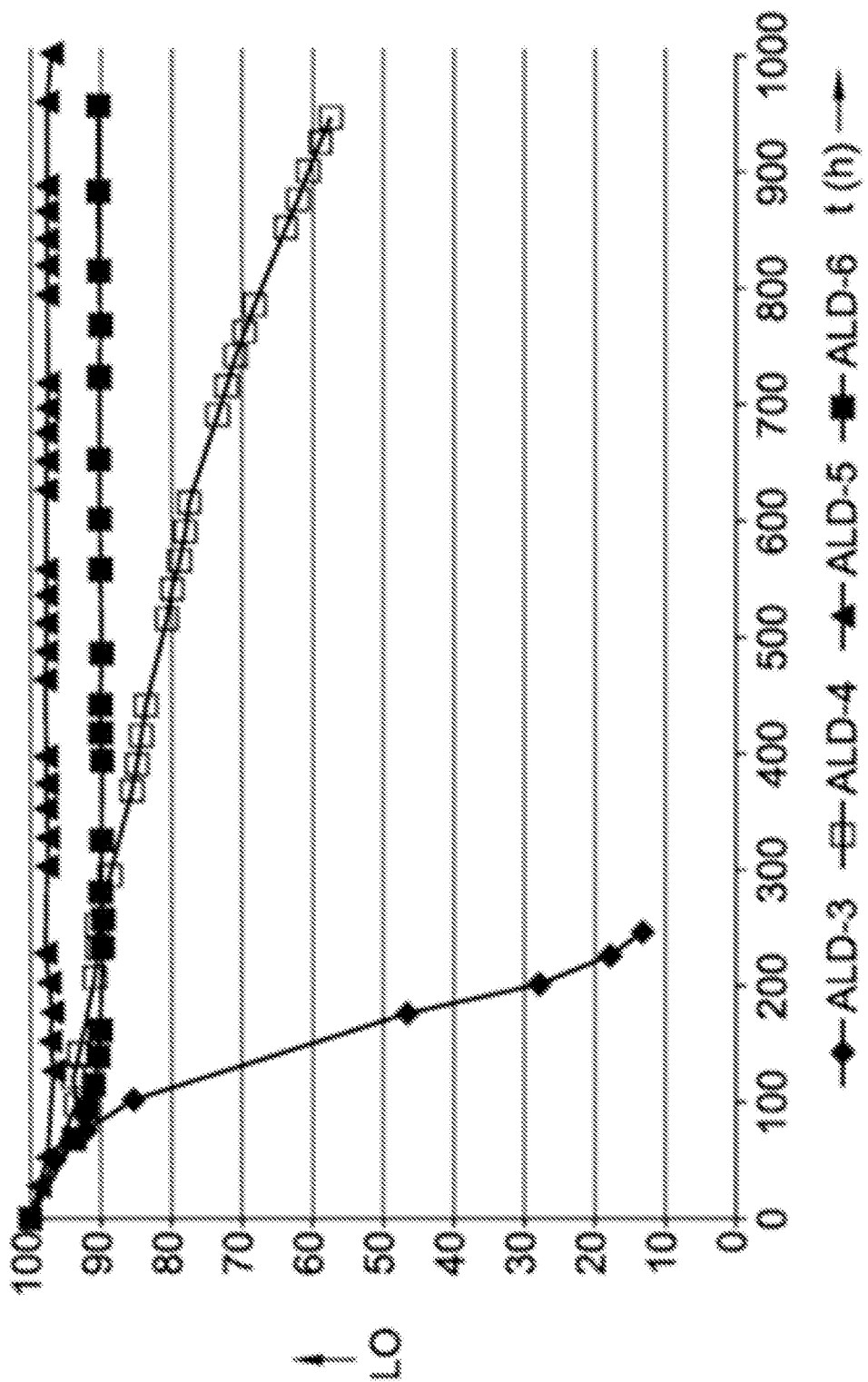
FIG. 6b shows the relative light output (LO) as a function of degradation time given in hours (85° C./100% RH); ALD-3: 20 nm $Al_2O_3$ on $SiO_2$ coating; ALD-4: 20 nm $Al_2O_3/Ta_2O_5$ nanolaminate; deposited on thin $SiO_2$ layer (<10 nm); ALD-5: 20 nm $Al_2O_3/Ta_2O_5$ nanolaminate; deposited on $SiO_2$ coating; ALD-6: 20 nm $Al_2O_3/HfO_2$ nanolaminate; deposited on $SiO_2$ coating.

FIG. 6b shows the relative light output as a function of degradation time given in hours (85° C./100% RH); ALD-3: 20 nm $Al_2O_3$ on $SiO_2$ coating; ALD-4: 20 nm $Al_2O_3/Ta_2O_5$ nanolaminate; deposited on thin $SiO_2$ layer (<10 nm); ALD-5: 20 nm $Al_2O_3/Ta_2O_5$ nanolaminate; deposited on $SiO_2$ coating; ALD-6: 20 nm $Al_2O_3/HfO_2$ nanolaminate; deposited on $SiO_2$ coating. Amongst others, from these drawings can be concluded that ALD multi-layers of $Al_2O_3$ and a second oxide provide superior behavior over a "simple" $Al_2O_3$ ALD coating. The ALD-3 sample in FIG. 6a is the same as in FIG. 6b; the measurement conditions (temperature) were however different.

Figure 6C:
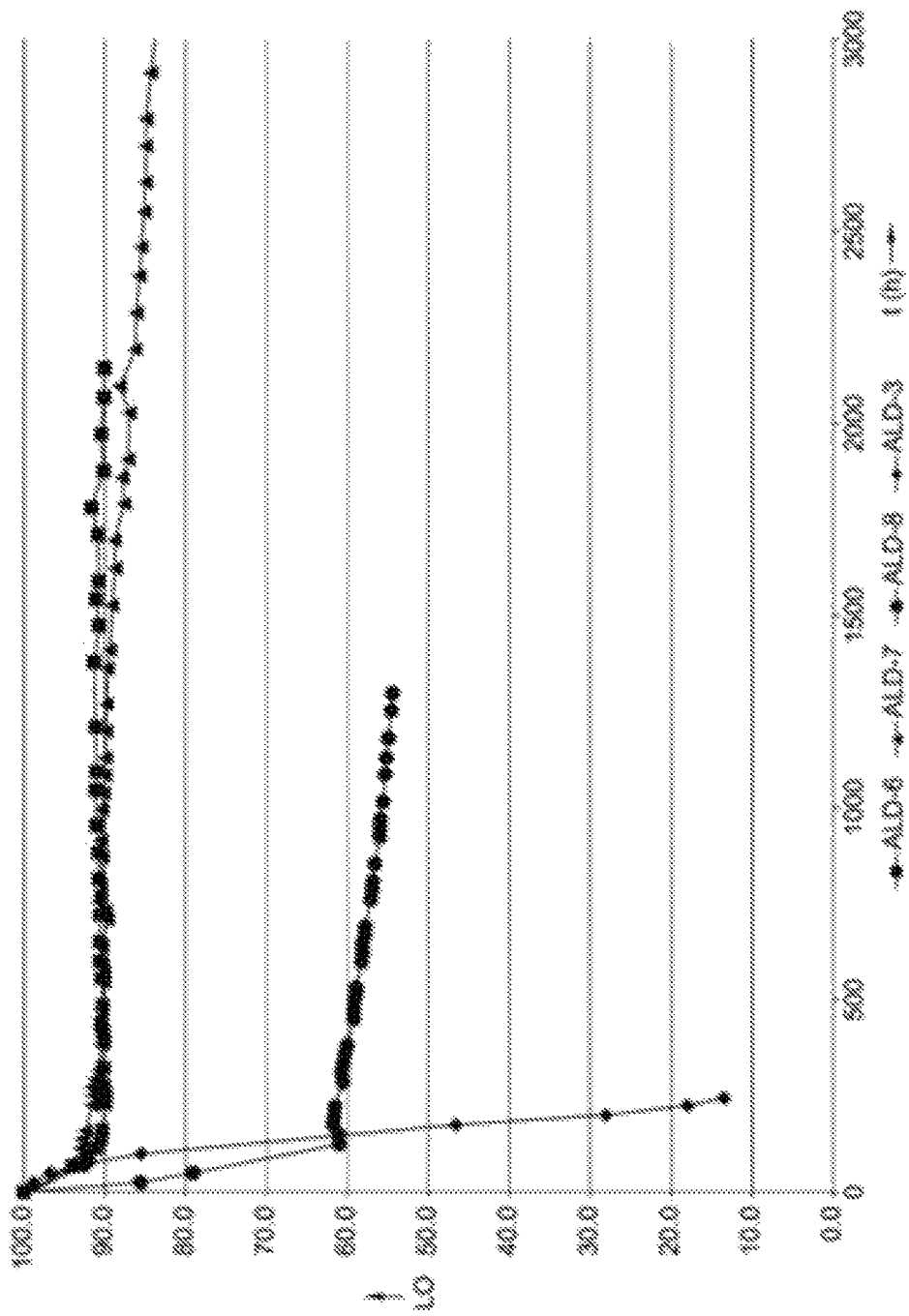
FIG. 6c shows the relative light output (LO) as a function of degradation time given in hours (85° C./100% RH); ALD-3 and ALD-6 samples as described above; ALD-7: 20 nm $Al_2O_3/HfO_2$ nanolaminate on thin $SiO_2$ layer (<10 nm), nanolaminate design: 4×[1.5 nm $Al_2O_3$/3.5 nm $HfO_2$]; ALD-8: 10 nm $Al_2O_3/HfO_2$ nanolaminate on thin $SiO_2$ layer (<10 nm), nanolaminate design: 2×[1.5 nm $Al_2O_3$/3.5 nm $HfO_2$]. The sol-gel $SiO_2$ coatings in general have a layer thickness in the range of 150-200 nm, unless indicated otherwise. The thin $SiO_2$ layers, indicated with thicknesses <10 nm in general will have a mean layer thickness in the range of about 1-10 nm.

FIG. 6c shows the relative light output (LO) as a function of degradation time given in hours (85° C./100% RH); ALD-3 and ALD-6 samples as described above; ALD-7 with 20 nm $Al_2O_3/HfO_2$ nanolaminate on thin $SiO_2$ layer (<10 nm) (nanolaminate design: 4×[1.5 nm $Al_2O_3$/3.5 nm $HfO_2$]) and ALD-8 with 10 nm $Al_2O_3/HfO_2$ nanolaminate on thin $SiO_2$ layer (<10 nm), nanolaminate design: 2×[1.5 nm $Al_2O_3$/3.5 nm $HfO_2$]. It is clear that thicker sol-gel layers and/or more stacked nanolaminates provide better results than those with a thin sol-gel layer or a multi-layer stack with only a few layers. ALD-5 and ALD-6 have sol-gel coatings in the range of about 100-200 nm.

Although particular implementations have been disclosed, these implementations are only examples and should not be taken as limitations. Various adaptations and combinations of features of the implementations disclosed are within the scope of the following claims.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. An array of light emitting structures, comprising:
light emitting structures disposed in a matrix, each of the light emitting structures being individually addressable and comprising:
a three-dimensional film each comprising luminescent particles and an inorganic coating disposed on the luminescent particles to bond the luminescent particles to each other, the luminescent particles configured to absorb light of a first wavelength and in response emit light of a second wavelength; and
a light emitting device configured to emit light, the three-dimensional film arranged in a path of the light emitted by the light emitting device.

2. The array as claimed in claim 1, wherein the light emitting device is a laser or electron beam.

3. The array as claimed in claim 1, wherein the light emitting structures are separated from each other by a separation material that is reflective or absorptive.

4. The array as claimed in claim 1, wherein the light emitting device is spaced apart from the three-dimensional film by 0.1 to 100 mm.

5. A lighting system, comprising:
an array of light emitting structures comprising light emitting structures arranged in a matrix, each of the light emitting structures comprising:
a three-dimensional film each comprising particles and an inorganic coating disposed on the particles to bond the particles to each other; and
a light emitting device configured to emit light, the three-dimensional film arranged in a path of the light emitted by the light emitting device; and
a secondary optic disposed in a light path of the array of light emitting structures.

6. The lighting system of claim 5, wherein the secondary optic is a dichroic filter.

7. The lighting system of claim 5, wherein the secondary optic is reflective.

8. The lighting system of claim 7, wherein the secondary optic is a distributed Bragg reflector.

9. The lighting system of claim 5, wherein the lighting system is at least part of a system of one of an automotive headlight, a camera flash, and a display.

10. The lighting system of claim 5, wherein the array of light emitting structures comprises 1000 to 10000 of the light emitting structures.

11. The lighting system of claim 5, wherein the light emitting device is a laser.

12. The lighting system of claim 5, wherein the secondary optic is one of a microelectromechanical system (MEMS) based mirror and an acousto-optic reflector or deflector.

13. The lighting system of claim 5, wherein the light emitting device is configured to emit infrared light.

14. A wavelength converting device, comprising:
a component comprising a gap;
a film disposed on the component to bridge the gap and comprising particles, the particles, the film being porous and comprising an inorganic coating disposed on the particles to bond the particles to each other and the component; and
wherein a coefficient of thermal expansion of the inorganic coating is substantially matched to a coefficient of thermal expansion of the particles.

15. The wavelength converting device of claim 14, wherein the component comprises pyrolytic graphite.

16. The wavelength converting device of claim 14, wherein the component comprises a silicon wafer.

17. The wavelength converting device of claim 14, wherein the particles are quantum dots.

18. The wavelength converting device of claim 14, wherein the particles have an average size from 0.5 to 40 microns.

19. The wavelength converting device of claim 14, wherein the inorganic coating comprises one of $Al_2O_3$, $SiO_2$, $Ta_2O_5$, $ZrO_2$, $TiO_2$, and $HfO_2$.

* * * * *